US012652888B2

(12) United States Patent

Lee et al.

(10) Patent No.: US 12,652,888 B2

(45) Date of Patent: Jun. 9, 2026

(54) DISPLAY DEVICE AND METHOD OF MANUFACTURING THE SAME

(71) Applicant: Samsung Display Co., LTD., Yongin-si (KR)

(72) Inventors: Jong Chan Lee, Yongin-si (KR); Hyun Kim, Yongin-si (KR); Jeong Su Park, Yongin-si (KR); Sung Jin Lee, Yongin-si (KR); Hyun Wook Lee, Yongin-si (KR); Woong Hee Jeong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 993 days.

(21) Appl. No.: 17/692,924

(22) Filed: Mar. 11, 2022

(65) Prior Publication Data

US 2022/0384684 A1 Dec. 1, 2022

(30) Foreign Application Priority Data

May 25, 2021 (KR) ......................... 10-2021-0067217

(51) Int. Cl.
  H10H 20/831 (2025.01)
  H10H 20/01 (2025.01)
  H10H 20/857 (2025.01)

(52) U.S. Cl.
  CPC ........ H10H 20/831 (2025.01); H10H 20/857 (2025.01); H10H 20/032 (2025.01)

(58) Field of Classification Search
  CPC ........................... H10H 20/831; H10D 86/451
  See application file for complete search history.

(56) References Cited

U.S. PATENT DOCUMENTS

| | | | | |
|---|---|---|---|---|
| 10,497,680 | B2 | 12/2019 | Sung et al. | |
| 10,658,605 | B2 | 5/2020 | Lee et al. | |
| 11,387,396 | B2 | 7/2022 | Rhee | |
| 2009/0200555 | A1* | 8/2009 | Ishihama | H10D 86/60 |
| | | | | 257/E21.535 |
| 2018/0019444 | A1* | 1/2018 | Yonehara | H05B 33/22 |
| 2021/0082992 | A1* | 3/2021 | Wei | H10F 39/811 |
| 2021/0408108 | A1 | 12/2021 | Kwag et al. | |
| 2022/0005978 | A1 | 1/2022 | Im et al. | |

(Continued)

FOREIGN PATENT DOCUMENTS

| | | |
|---|---|---|
| KR | 10-1874993 B1 | 6/2018 |
| KR | 10-2019-0029831 A | 3/2019 |

(Continued)

OTHER PUBLICATIONS

Choi et al., Precise Placement of Metallic Nanowires on a Substrate by Localized Electric Fields and Inter-Nanowire Electrostatic Interaction, Nanomaterials (Oct. 19, 2017) 11 pgs.

*Primary Examiner* — Calvin Y Choi

(74) *Attorney, Agent, or Firm* — Womble Bond Dickinson (US) LLP

(57) ABSTRACT

A display device includes a base layer; a via layer over the base layer, the via layer having a concave groove; a light emitting element in the groove; a first electrode over the via layer; a second electrode over the via layer and spaced from the first electrode; and an anchor over the light emitting element within the groove. A first conductor is in the groove and covers an end of the light emitting element.

15 Claims, 21 Drawing Sheets

(56) References Cited

U.S. PATENT DOCUMENTS

| 2022/0059739 | A1 | 2/2022 | Li et al. |
| 2022/0140186 | A1 | 5/2022 | Min et al. |

FOREIGN PATENT DOCUMENTS

| KR | 10-2048994 | B1 | 11/2019 | | |
| KR | 10-2020-0010685 | A | 1/2020 | | |
| KR | 10-2020-0059377 | * | 5/2020 | ............ | H01L 33/36 |
| KR | 10-2020-0059377 | A | 5/2020 | | |
| KR | 10-2020-0060602 | * | 6/2020 | .......... | H10H 20/819 |
| KR | 10-2020-0060602 | A | 6/2020 | | |
| KR | 10-2020-0077671 | A | 7/2020 | | |
| KR | 10-2020-0102615 | A | 9/2020 | | |

* cited by examiner

OCD2: OCD21, OCD22, OCD23

OCD2: OCD21, OCD22, OCD23

OCD2: OCD21, OCD22, OCD23

OCD2: OCD21, OCD22, OCD23

DISPLAY DEVICE AND METHOD OF MANUFACTURING THE SAME

CROSS-REFERENCE TO RELATED APPLICATION

This application claims priority to and the benefit of Korean patent application number 10-2021-0067217 filed on May 25, 2021, the entire content of which is incorporated by reference herein.

BACKGROUND

1. Field

Various embodiments of the present disclosure relate to a display device and a method of manufacturing the display device.

2. Description of Related Art

With an increase in interest in an information display and an increase in demand to use portable information media, demand for display devices is markedly increased, and commercialization thereof is in progress.

SUMMARY

Various embodiments of the present disclosure are directed to a display device capable of solving a short circuit issue that may occur due to direct contact of a contact electrode with ends of a light emitting element, and a method of manufacturing the display device.

One or more embodiments of the present disclosure may provide a display device including a base layer; a via layer on the base layer, the via layer having a concave groove; a light emitting element in the groove; a first electrode on the via layer; a second electrode on the via layer and spaced from the first electrode; and an anchor on the light emitting element within the groove, wherein a first conductor is in the groove and covers ends of the light emitting element.

In one or more embodiments, the display device may further include a first insulating layer covering at least a portion of the first electrode, at least a portion of the second electrode, and a surface of the groove.

In one or more embodiments, the display device may further include a first contact electrode and a second contact electrode spaced from each other with the anchor being interposed therebetween.

In one or more embodiments, the first contact electrode may be on an upper surface of the first conductor covering a first end of the light emitting element and an upper surface of the first insulating layer, and the first contact electrode may be electrically connected to the first electrode exposed by the first insulating layer.

In one or more embodiments, the first contact electrode and the first end of the light emitting element may be electrically connected to each other via the first conductor.

In one or more embodiments, the second contact electrode may be on an upper surface of the first conductor covering a second end of the light emitting element and an upper surface of the first insulating layer, and the second contact electrode may be electrically connected to the second electrode exposed by the first insulating layer.

In one or more embodiments, the second contact electrode and the second end of the light emitting element may be electrically connected to each other via the first conductor.

In one or more embodiments, the first conductor may include at least one of PCBM, $Alq_3$, LiF, and PBD(1-(3,4-dimethoxyphenyl)-3-[3-(1H-imidazol-1-yl)propyl]thiourea).

In one or more embodiments, a width of the groove may be greater than a length of the light emitting element, and a depth of the groove may be greater than a diameter of the light emitting element.

In one or more embodiments, the anchor may include an organic material, and diameters of upper and lower sides of the anchor may be equal to or different from each other in a cross-section.

One or more embodiments of the present disclosure may provide a method of manufacturing a display device including aligning a light emitting element in a groove, on a via layer in which the groove is formed; forming an anchor on the light emitting element; forming a first conductor to cover ends of the light emitting element in the groove; forming a contact electrode on the first conductor and the anchor, and applying a photo resist onto a first portion of the contact electrode; and forming a first contact electrode and a second contact electrode, by etching a second portion of the contact electrode exposed by the photo resist.

In one or more embodiments, a width of the groove may be greater than a length of the light emitting element, and a depth of the groove may be greater than a diameter of the light emitting element.

In one or more embodiment, the anchor may be formed such that a first end of the light emitting element and a second end of the light emitting element are exposed, and a portion of the light emitting element is enclosed.

In one or more embodiments, the first conductor may cover a first end of the light emitting element on a first side of the anchor, and may cover a second end of the light emitting element on a second side of the anchor.

In one or more embodiments, the photo resist may be applied such that portions thereof are spaced apart from each other with respect to the anchor, and a height of the photo resist may be formed to be lower than an upper surface of the anchor.

One or more embodiments of the present disclosure may provide a display device including a base layer; a via layer on the base layer, the via layer having a concave groove; a light emitting element in the groove; a first electrode on the via layer; a second electrode on the via layer and spaced from the first electrode; a first insulating layer covering at least a portion of the first electrode, at least a portion of the second electrode, and a surface of the groove; an anchor on the light emitting element within the groove; and a second conductor on the first insulating layer, the second conductor covering an end of the light emitting element in the groove.

In one or more embodiments, a first portion of the second conductor may be cover the groove, a second portion of the second conductor may cover a first end of the light emitting element and be electrically connected to the first electrode, and a third portion of the second conductor may covers a second end of the light emitting element and be electrically connected to the second electrode.

In one or more embodiments, the second conductor may include $n^+$ amorphous silicon.

In one or more embodiments, the anchor may include an organic material, and diameters of upper and lower sides of the anchor may be equal to or different from each other in a cross-section.

In one or more embodiments, a width of the groove may be greater than a length of the light emitting element, and a depth of the groove may be greater than a diameter of the light emitting element.

DETAILED DESCRIPTION

Figure 1:
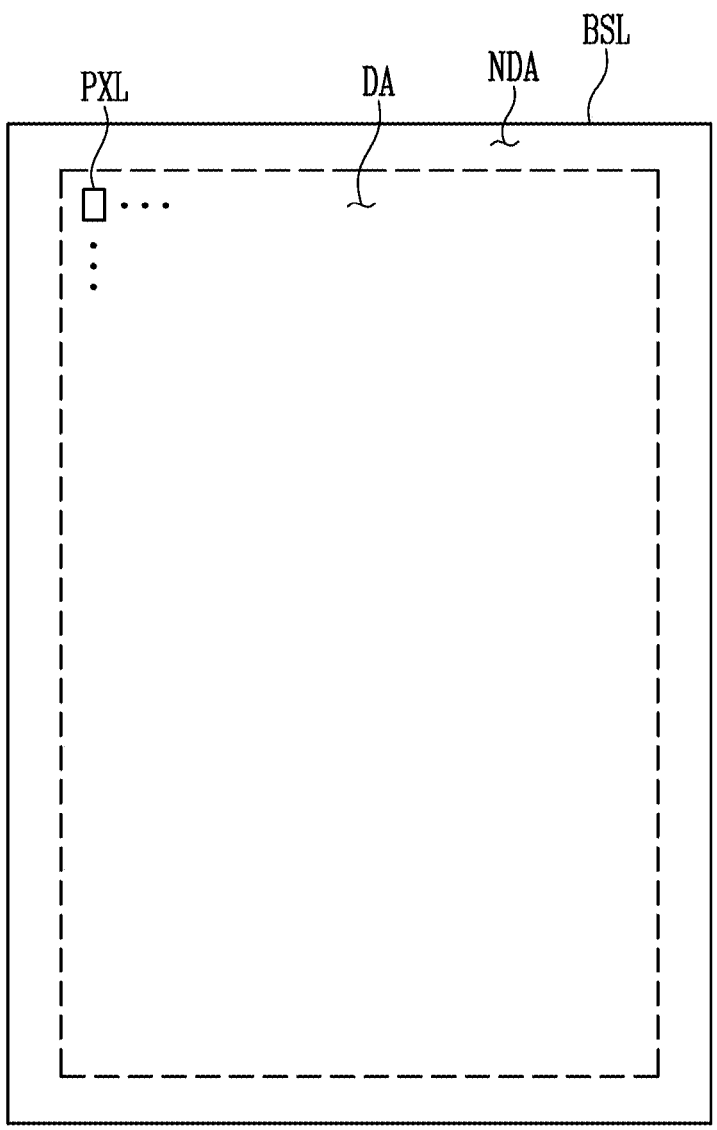
FIG. 1 is a plan view schematically illustrating a display device in accordance with one or more embodiments.
Figure 1:
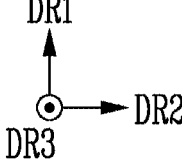

As the present disclosure allows for various changes and numerous embodiments, some embodiments will be illustrated in the drawings and described in detail in the written description. However, this is not intended to limit the present disclosure to particular modes of practice, and it is to be appreciated that all changes, equivalents, and substitutes that do not depart from the spirit and technical scope are encompassed in the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, an area, or a plate is disposed on a second part, the first part may be not only directly on the second part but a third part may intervene between them. In addition, when it is expressed that a first part such as a layer, a film, an area, or a plate is formed on a second part, the surface of the second part on which the first part is formed is not limited to an upper surface of the second part but may include other surfaces such as a side surface or a lower surface of the second part. To the contrary, when a first part such as a layer, a film, an area, or a plate is under a second part, the first part may be not only directly under the second part but a third part may intervene between them.

Hereinafter, a display device in accordance with one or more embodiments will be described with reference to the attached drawings.

Figure 2:
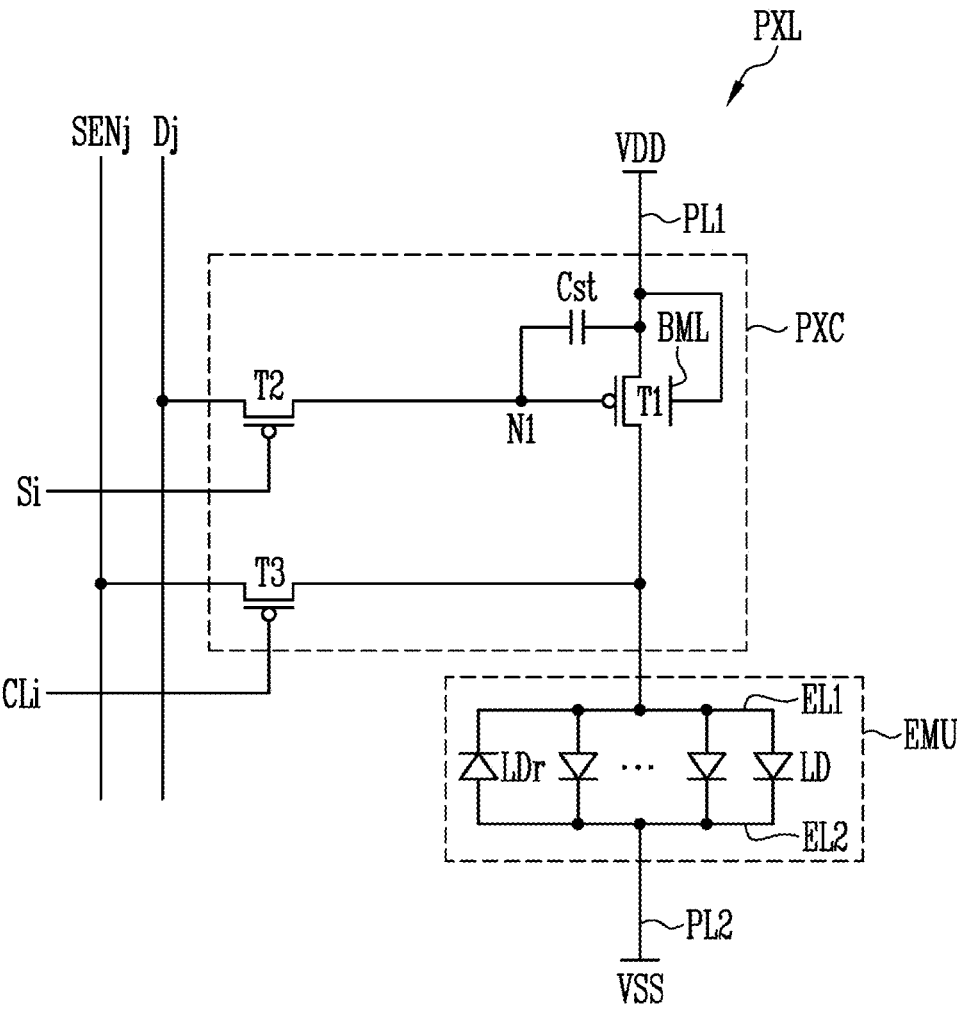
FIG. 2 is a circuit diagram illustrating one pixel of a display device in accordance with one or more embodiments.

FIG. 1 is a plan view schematically illustrating a display device in accordance with one or more embodiments, and FIG. 2 is a circuit diagram illustrating one pixel of a display device in accordance with one or more embodiments.

First, referring to FIG. 1, the display device in accordance with one or more embodiments may include a base layer BSL and a plurality of pixels PXL disposed on the base layer BSL.

The base layer BSL may constitute a base member of the display device. In one or more embodiments, the base layer BSL may be a rigid or flexible substrate or film, and the material or properties thereof are not particularly limited. For example, the base layer BSL may be a rigid substrate made of glass or reinforced glass, a soft substrate (or a thin film) made of plastic or metal material, or at least one insulating film, and the material and/or properties thereof are not particularly limited.

The base layer BSL may include a display region DA on which an image is displayed, and a non-display region NDA excluding the display region DA. The non-display region NDA may be a region in which an image is not displayed, and may be a Bezel region configured to enclose the display region DA.

The display region DA may be located on a surface of the display device. For example, the display region DA may be located on a front surface of the display device, and may be additionally located on side and rear surfaces of the display device.

The non-display region NDA is located around an edge or periphery of the display region DA to enclose the display region DA. The non-display region NDA may selectively include lines, pads, and a driving circuit connected to the pixels PXL of the display region DA.

Although only one pixel PXL is shown in FIG. 1, the plurality of pixels PXL may be substantially distributed and disposed in the display region DA. In one or more embodiments, the pixels PXL may be arranged in a matrix or stripe array structure in the display region DA. For example, the pixels PXL may be arranged along rows and columns of a matrix in the display region DA. However, the present disclosure is not limited thereto.

Referring to FIG. 2, one pixel PXL may include at least one emission unit EMU that generates light having luminance corresponding to a data signal. Further, one pixel PXL may selectively further include a pixel circuit PXC config-ured to drive the emission unit EMU.

The emission unit EMU may include light emitting ele-ments LD connected in parallel between a first power line PL1 to which the voltage of a first driving power supply VDD is applied and a second power line PL2 to which the voltage of a second driving power supply VSS is applied.

In detail, the emission unit EMU may include a first electrode EL1 connected to the first driving power supply VDD via the pixel circuit PXC and the first power line PL1, a second electrode EL2 connected to the second driving power supply VSS via the second power line PL2, and light emitting elements LD connected in parallel in the same direction between the first electrode EL1 and the second electrode EL2. In one or more embodiments, the first electrode EL1 may be an anode, and the second electrode EL2 may be a cathode.

Each of the light emitting elements LD included in the emission unit EMU may include a first end connected to the first driving power supply VDD through the first electrode EL1, and a second end connected to the second driving power supply VSS through the second electrode EL2.

The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first driving power supply VDD and the second driving power supply VSS may be set to a value equal to or greater than the threshold voltage of the light emitting elements LD during an emission period of the pixel PXL.

As described above, the light emitting elements LD that are connected in parallel in the same direction (e.g. forward direction) between the first electrode EL1 and the second electrode EL2 to which voltages having different potentials are respectively supplied may form respective valid light sources. The valid light sources may be collected to form the emission unit EMU of the pixel PXL.

In one or more embodiments, the emission unit EMU may further include at least one invalid light source, e.g. a reverse light emitting element LDr, as well as the light emitting elements LD that form the respective valid light sources. The reverse light emitting element LDr, along with the light emitting elements LD that form the valid light sources, may be connected in parallel to each other between the first electrode EL1 and the second electrode EL2. Here, the reverse light emitting element LDr may be connected between the first electrode EL1 and the second electrode EL2 in a direction opposite to that of the light emitting elements LD. Even when a driving voltage (e.g., a prede-termined driving voltage or a forward driving voltage) is applied between the first electrode EL1 and the second electrodes EL2, the reverse light emitting element LDr remains deactivated. Hence, current substantially does not flow through the reverse light emitting element LDr.

The light emitting elements LD of the emission unit EMU may emit light having luminance corresponding to driving current supplied thereto through the pixel circuit PXC. For example, during each frame period, the pixel circuit PXC may supply driving current corresponding to a gray scale value of one frame data to the emission unit EMU. The driving current supplied to the emission unit EMU may separately flow into each of the light emitting elements LD. Hence, each of the light emitting elements LD may emit light having a luminance corresponding to current applied thereto, so the emission unit EMU may emit light having a luminance corresponding to the driving current.

Although FIG. 2 shows an embodiment in which all of the light emitting elements LD constituting the emission unit EMU are connected in parallel, the present disclosure is not limited thereto. In one or more embodiments, the emission unit EMU may include two serial stages. In one or more embodiments, the light emitting elements LD may be con-nected via n serial stages. In other words, the emission unit EMU may be formed in a serial/parallel mixed structure.

The pixel circuit PXC may be connected to a scan line Si and a data line Dj of one pixel PXL. For example, in case that the pixel PXL is disposed on an i-th row (i is a natural number) and a j-th column (j is a natural number) of the display region DA (see FIG. 1), the pixel circuit PXC of the pixel PXL may be connected to an i-th scan line Si and a j-th data line Dj of the display region DA. Further, the pixel circuit PXC may be connected to an i-th control line CLi and a j-th sensing line SENj of the display region DA.

The pixel circuit PXC may include a first transistor T1, a second transistor T2, a third transistor T3, and a storage capacitor Cst.

A first terminal of the first transistor T1 (or the driving transistor) is connected to the first driving power supply VDD, and a second terminal thereof is electrically connected to the first electrode EL1 of the emission unit EMU. A gate electrode of the first transistor T1 is connected to a first node N1. Thus, the first transistor T1 may control the amount of driving current that are supplied to the light emitting ele-ments LD in response to the voltage of the first node N1.

In one or more embodiments, the first transistor T1 may selectively include a bottom metal layer BML. The gate electrode and the bottom metal layer BML of the first transistor T1 may overlap each other with an insulating layer interposed therebetween.

A first terminal of the second transistor (or the switching transistor) T2 is connected to the data line Dj, and a second terminal thereof is connected to the first node N1. A gate electrode of the second transistor T2 is connected to the scan line Si. When a scan signal having a turn-on voltage (e.g., a low level voltage) is supplied from the scan line Si, the second transistor T2 is turned on to electrically connect the first node N1 to the data line Dj. Here, if a data signal of one frame is supplied to the data line Dj, the data signal is transmitted to the first node N1. The data signal transmitted to the first node N1 is charged in the storage capacitor Cst.

The third transistor T3 is connected between the first transistor T1 and the sensing line SENj. For example, the first terminal of the third transistor T3 is connected to the second terminal of the first transistor T1, and the second terminal of the third transistor T3 is connected to the sensing line SENj. The gate electrode of the third transistor T3 is connected to the control line CLi. The third transistor T3 is turned on by the control signal (e.g., a low level voltage) of the gate-on voltage supplied to the control line CLi for a sensing period (e.g., a predetermined sensing period), thus electrically connecting the sensing line SENj and the first transistor T1. The sensing period may be a period for extracting characteristic information (e.g., the threshold voltage of the first transistor T1) of each of the pixels PXL disposed in the display region DA.

One electrode of the storage capacitor Cst is connected to the first node N1, while the other electrode is connected to the first terminal of the first transistor T1. The storage capacitor Cst may be charged with a voltage (or holds a charge) corresponding to a data signal supplied to the first node N1 and a voltage corresponding to a voltage difference of the first terminal of the first transistor T1, and may maintain the charged voltage until a data signal of a subsequent frame is supplied.

Although FIG. 2 illustrates an embodiment in which all of the first to third transistors T1 to T3 are P-type transistors, the present disclosure is not limited thereto. In one or more embodiments, at least one of the first to third transistors T1 to T3 may be changed to an N-type transistor.

Further, although FIG. 2 illustrates an embodiment in which the emission unit EMU is connected between the pixel circuit PXC and the second driving power supply VSS, the emission unit EMU may be connected between the first driving power supply VDD and the pixel circuit PXC.

Hereinafter, a light emitting element included in a display device and a pixel in accordance with one or more embodiment will be described with reference to FIG. 3.

Figure 3:
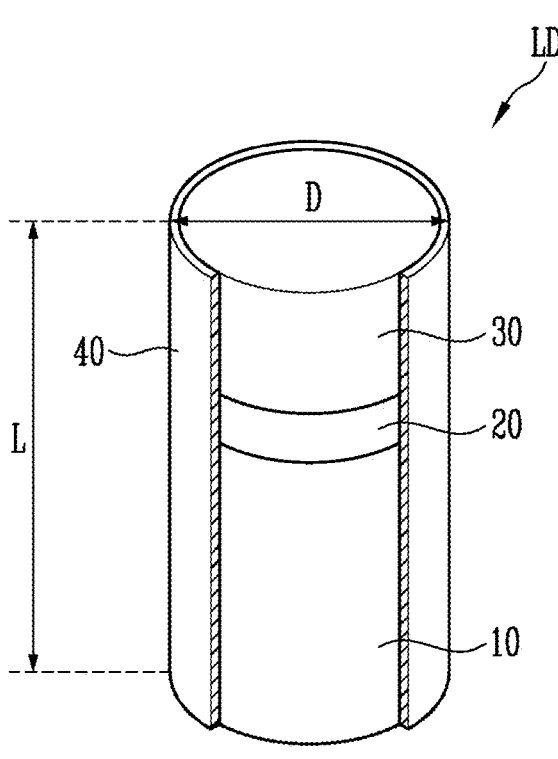
FIG. 3 is a perspective view illustrating a light emitting element in accordance with one or more embodiments.

FIG. 3 is a perspective view illustrating a light emitting element in accordance with one or more embodiments.

Referring to FIG. 3, the light emitting element LD included in the display device in accordance with one or more embodiments includes at least a first semiconductor layer 10, an active layer 20, and a second semiconductor layer 30. For example, the light emitting element LD may be configured as a stacked body formed by successively stacking the first semiconductor layer 10, the active layer 20, and the second semiconductor layer 30 in a direction of a length L.

The light emitting element LD may be provided in the shape of a rod extending in one direction, i.e., a cylindrical shape. If the direction in which the light emitting element LD extends is defined as the direction of the length L, the light emitting element LD may have a first end and a second end in the direction of the length L. Although FIG. 3 illustrates the columnar light emitting element LD, the type and/or shape of the light emitting element LD in accordance with one or more embodiments are not limited thereto.

The light emitting element LD may be a rod-type light emitting diode manufactured in the shape of a rod. In this specification, the term "rod-type" embraces a rod-like shape and a bar-like shape such as a cylindrical shape and a prismatic shape extending in the direction of the length L (i.e., to have an aspect ratio greater than 1), and the cross-sectional shape thereof is not limited to a particular shape. For example, the length L of the light emitting element LD may be greater than a diameter D thereof (or a width of the cross-section thereof). However, the present disclosure is not limited thereto. According to one or more embodiments, the light emitting element LD may have the shape of a rod or a bar that is short in the direction of the length L (i.e., to have an aspect ratio smaller than 1). Further, in one or more embodiments, the light emitting element LD may have the shape of a rod, a bar, or the like, in which the length L and the diameter D are the same.

The light emitting element LD may have a small size corresponding to a range from a nanometer scale size to a micrometer scale size. The light emitting element LD may have a diameter D and/or a length L in the range from the nanometer scale to the micrometer scale. For instance, the length L of the light emitting element LD may be about 4 μm, and the diameter D of the light emitting element LD may be about 0.5 μm. However, in the present disclosure, the size of the light emitting element LD is not limited thereto. For example, the size of the light emitting element LD may be changed in various ways depending on design conditions of various devices, e.g., a display device, which employs, as a light source, a light emitting device using the light emitting element LD.

The first semiconductor layer 10 may include at least one n-type semiconductor layer. For instance, the first semiconductor layer 10 may include an n-type semiconductor layer that includes any one semiconductor material of InAlGaN, GaN, AlGaN, InGaN, AlN, and InN and is doped with a first conductive dopant such as Si, Ge, or Sn. However, the material forming the first semiconductor layer 10 is not limited thereto, and the first semiconductor layer 10 may be formed of various other materials.

The active layer 20 may be disposed on the first semiconductor layer 10 and have a single or multiple quantum well structure. In one or more embodiments, a cladding layer doped with a conductive dopant may be formed over and/or under the active layer 20. For example, the cladding layer may be formed of an AlGaN layer or an InAlGaN layer. In one or more embodiments, a material such as AlGaN or InAlGaN may be used to form the active layer 20, and various other materials may be used to form the active layer 20.

If a voltage equal to or greater than a threshold voltage is applied to the opposite ends of the light emitting element LD, the light emitting element LD emits light by coupling electron-hole pairs in the active layer 20. Because the light emission of the light emitting element LD is controlled based on the foregoing principle, the light emitting element LD may be used as a light source of various light emitting devices as well as the pixel of the display device.

The second semiconductor layer 30 may be disposed on the active layer 20 and may include a semiconductor layer having a type different from that of the first semiconductor layer 10. For example, the second semiconductor layer 30 may include at least one p-type semiconductor layer. For instance, the second semiconductor layer 30 may include a p-type semiconductor layer that includes at least one semiconductor material of InAlGaN, GaN, AlGaN, InGaN, AlN, and InN, and is doped with a second conductive dopant such as Mg, Zn, Ca, Sr, or Ba. However, the material forming the second semiconductor layer 30 is not limited thereto, and the second semiconductor layer 30 may be formed of various other materials.

In the above-described embodiment, it has been described that each of the first semiconductor layer 10 and the second semiconductor layer 30 is composed of a single layer, but the present disclosure is not limited thereto. In one or more embodiments, depending on the material of the active layer 20, each of the first semiconductor layer 10 and the second semiconductor layer 30 may further include one or more layers, e.g., a cladding layer and/or a Tensile Strain Barrier Reducing (TSBR) layer. The TSBR layer may be a strain buffer layer which is disposed between semiconductor layers having different lattice structures to serve as a buffer for reducing a difference in lattice constant. Although the TSBR layer may be formed of a p-type semiconductor layer such as p-GaInP, p-AlInP, or p-AlGaInP, the present disclosure is not limited thereto.

Furthermore, in one or more embodiments, the light emitting element LD may further include on a surface thereof an insulating film 40. The insulating film 40 may be formed on the surface of the light emitting element LD to enclose an outer surface (e.g., an outer peripheral or circumferential surface) of the active layer 20. In addition, the insulating film may further enclose a region of each of the first and second semiconductor layers 10 and 30. However, in one or more embodiments, the insulating film 40 may allow the opposite ends of the light emitting element LD having different polarities to be exposed to the outside. For example, the insulating film 40 may not cover but expose one end of each of the first and second semiconductor layers 10 and 30 located at the opposite ends of the light emitting element LD in the direction of the length L, for example, two bottom surfaces (e.g., the upper and lower surfaces of the light emitting element LD) of the cylinder.

If the insulating film 40 is provided on the surface of the light emitting element LD, for example, on the surface of the active layer 20, the active layer 20 may be prevented from short-circuiting with at least one electrode, e.g., at least one contact electrode of contact electrodes connected to the opposite ends of the light emitting element LD, etc. Consequently, the electrical stability of the light emitting element LD may be secured.

Furthermore, the insulating film 40 on the surface of the light emitting element LD reduces or minimizes a defect on the surface of the light emitting element LD, and thereby improves or enhances the lifetime and efficiency of the light emitting element. In addition, if the insulating film 40 is included on each light emitting element LD, even when a plurality of light emitting elements LD are disposed adjacent to each other, the undesired short-circuiting between the light emitting elements LD may be prevented.

Further, in one or more embodiments, the light emitting element LD may be manufactured through a surface treatment process. For example, the light emitting element LD may be surface-treated so that, when the plurality of light emitting elements LD are mixed with a fluidic solution (or solvent) and then supplied to each emission region (e.g., an emission region of each pixel), the light emitting elements LD can be uniformly distributed without non-uniformly aggregating in the solution.

In one or more embodiments, the light emitting element LD may further include additional components as well as the first semiconductor layer 10, the active layer 20, the second semiconductor layer 30, and/or the insulating film 40. For example, the light emitting element LD may further include at least one fluorescent layer, at least one active layer, at least one semiconductor layer and/or at least one electrode disposed on one end of the first semiconductor layer 10, the active layer 20, and the second semiconductor layer 30.

The light emitting element LD may be used in various types of devices including a display device that requires a light source. For instance, at least one light emitting element LD (e.g., a plurality of light emitting elements LD each having a size ranging from a nanometer scale to a micrometer scale) may be disposed in each pixel region of the display device to form a light source (or, a light source unit) of the corresponding pixel using the light emitting elements LD. Furthermore, the application field of the light emitting element LD according to the present disclosure is not limited to the display device. For example, the light emitting element LD may also be used in various devices such as a lighting device, which requires a light source.

Hereinafter, a display device in accordance with one or more embodiments will be described with reference to FIGS. 4 and 5.

Figure 4:
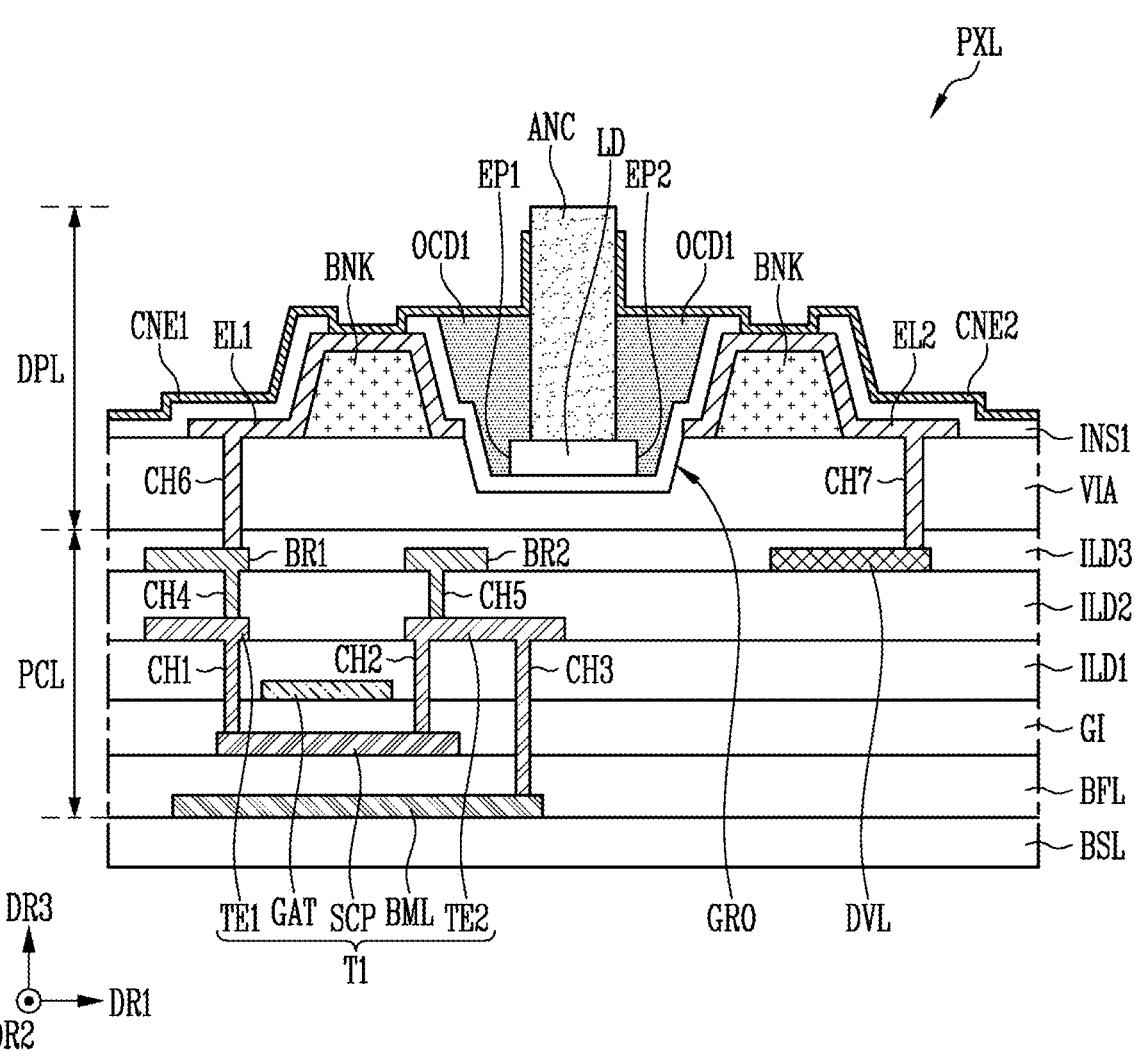
FIG. 4 is a sectional view illustrating one pixel of a display device in accordance with one or more embodiments.
Figure 5:
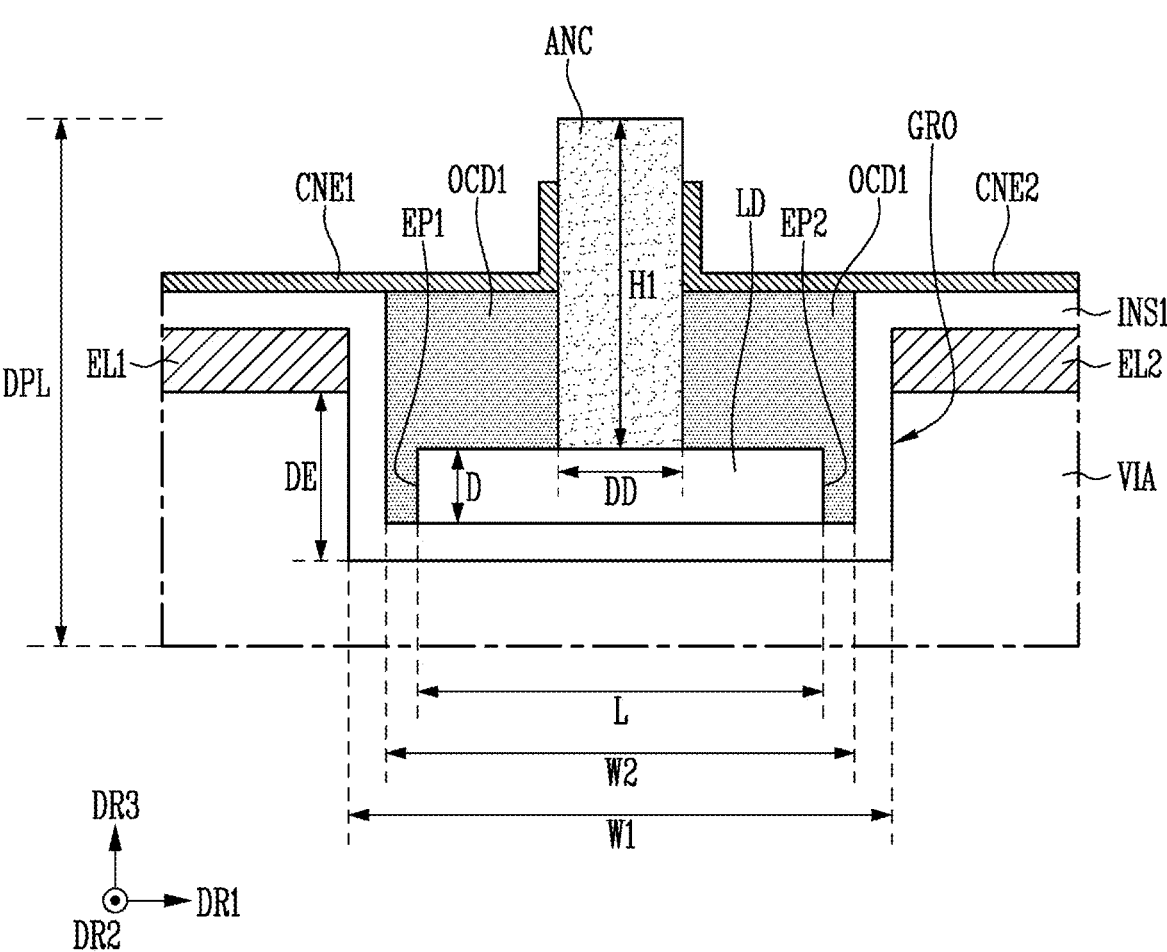
FIG. 5 is a sectional view illustrating a display element layer in a display device in accordance with one or more embodiments.

FIG. 4 is a sectional view illustrating one pixel of a display device in accordance with an embodiment, and FIG. 5 is a sectional view illustrating a display element layer in a display device in accordance with an embodiment.

Referring to FIG. 4, one pixel of the display device in accordance with one or more embodiments may include a base layer BSL, a pixel circuit layer PCL, and a display element layer DPL.

The base layer BSL may be a rigid substrate or a flexible substrate. For example, when the base layer BSL is the rigid substrate, the base layer BSL may be implemented as a glass substrate, a quartz substrate, a glass ceramic substrate, a crystalline glass substrate, or the like. When the base layer BSL is the flexible substrate, the base layer BSL may be implemented as a polymer organic substrate including polyimide, polyamide, or the like, a plastic substrate, or the like.

The pixel circuit layer PCL is located over the base layer BSL.

The pixel circuit layer PCL may include at least one transistor, a storage capacitor, and a plurality of lines connected thereto. Further, the pixel circuit layer PCL may include a buffer layer BFL, a gate insulating layer GI, a first interlayer insulating layer ILD1, a second interlayer insulating layer ILD2, and a third interlayer insulating layer ILD3, which are successively stacked on a surface of the base layer BSL.

The bottom metal layer BML is positioned between the base layer BSL and the buffer layer BFL. The bottom metal layer BML is positioned to at least partially overlap a semiconductor pattern SCP and a gate electrode GAT of the first transistor T1 in a thickness direction of the base layer BSL (i.e., a third direction DR3) which will be described later. The bottom metal layer BML may be connected to a second electrode TE2 of the first transistor T1 through contact holes of the buffer layer BFL, the gate insulating layer GI, and the first interlayer insulating layer ILD1. Here, the second electrode TE2 of the first transistor T1 may have the same configuration as the first terminal of the first transistor T1 of FIG. 2.

The buffer layer BFL is positioned over the base layer BSL and the bottom metal layer BML. The buffer layer BFL may cover the base layer BSL and the bottom metal layer BML. The buffer layer BFL may prevent impurities from being diffused from an external device into the pixel circuit layer PCL. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). In some embodiments, the buffer layer BFL may be omitted.

The semiconductor pattern SCP of the first transistor T1 is located over the buffer layer BFL. The semiconductor pattern SCP may include a channel region, and a source region and a drain region positioned on both sides of the channel region. The source region of the semiconductor pattern SCP may be electrically connected to the second electrode TE2, and the drain region thereof may be electrically connected to the first electrode TE1. In other words, the source region and the drain region may be extended to be electrically connected to electrodes of other layers through the contact holes, respectively.

The semiconductor pattern SCP may include at least one of polysilicon, amorphous silicon, and oxide semiconductor.

The gate insulating layer GI is positioned over the semiconductor pattern SCP and the buffer layer BFL. The gate insulating layer GI covers the semiconductor pattern SCP and the buffer layer BFL. The gate insulating layer GI may include an inorganic material. For example, the gate insulating layer GI may include at least one of silicon nitride ($SiN_x$), silicon oxide ($SiO_x$), silicon oxynitride ($SiO_xN_y$), and aluminum oxide ($AlO_x$). In one or more embodiments, the gate insulating layer GI may include an organic material.

The gate electrode GAT of the first transistor T1 is located over the gate insulating layer GI. The gate electrode GAT may be located to overlap the channel region of the semiconductor pattern SCP in the third direction DR3.

The first interlayer insulating layer ILD1 is positioned over the gate electrode GAT and the gate insulating layer GI.

The first interlayer insulating layer ILD1 covers the gate electrode GAT and the gate insulating layer GI.

The first interlayer insulating layer ILD1 may include the same material as the gate insulating layer GI, and may include at least one of silicon nitride (SiN$_x$), silicon oxide (SiO$_x$), silicon oxynitride (SiO$_x$N$_y$), and aluminum oxide (AlO$_x$), for example.

The first electrode TE1 and the second electrode TE2 of the first transistor T1 are located over the first interlayer insulating layer ILD1. The first electrode TE1 may be a drain electrode connected to the drain region of the semiconductor pattern SCP, and the second electrode TE2 may be a source electrode connected to the source region of the semiconductor pattern SCP. Here, the first electrode TE1 may have the same configuration as the second terminal of the first transistor T1 of FIG. 2.

The first electrode TE1 may be electrically connected to the first electrode EL1 of the display element layer DPL, which will be described later, through a fourth contact hole CH4, a first bridge electrode BR1, and a sixth contact hole CH6. Thus, the first transistor T1 may transmit the voltage of the first driving power supply VDD to the first electrode EL1. In one or more embodiments, the first electrode TE1 may be a source electrode, and the second electrode TE2 may be a drain electrode.

The second interlayer insulating layer ILD2 is located over the first interlayer insulating layer ILD1, the first electrode TE1 of the first transistor T1, and the second electrode TE2 of the first transistor T1. The second interlayer insulating layer ILD2 covers the first interlayer insulating layer ILD1, the first electrode TE1 of the first transistor T1, and the second electrode TE2 of the first transistor T1.

The second interlayer insulating layer ILD2 may include at least one of silicon nitride (SiN$_x$), silicon oxide (SiO$_x$), and silicon oxynitride (SiO$_x$N$_y$). In one or more embodiments, the second interlayer insulating layer ILD2 may be an organic insulating film including organic material.

The first bridge electrode BR1, the second bridge electrode BR2, and a driving voltage line DVL are positioned over the second interlayer insulating layer ILD2.

The first bridge electrode BR1 may be physically and/or electrically connected to the first electrode TE1 of the first transistor T1 through the fourth contact hole CH4 of the second interlayer insulating layer ILD2. Further, the first bridge electrode BR1 may be physically and/or electrically connected to the first electrode EL1 of the display element layer DPL through the sixth contact hole CH6 of a via layer VIA and the third interlayer insulating layer ILD3, which will be described later. Thus, the voltage of the first driving power supply VDD (see FIG. 2) transmitted to the second electrode TE2 of the first transistor T1 may be transmitted to the first electrode EL1 of the display element layer DPL.

The second bridge electrode BR2 may be physically and/or electrically connected to the second electrode TE2 of the first transistor T1 through the fifth contact hole CH5 of the second interlayer insulating layer ILD2.

The driving voltage line DVL may be physically and/or electrically connected to the second electrode EL2 of the display element layer DPL through the seventh contact hole CH7 of the via layer VIA and the third interlayer insulating layer ILD3, which will be described later. Here, the driving voltage line DVL may correspond to a portion of the second power line PL2 of FIG. 2. Thus, the voltage of the second driving power supply VSS (see FIG. 2) transmitted to the driving voltage line DVL may be transmitted to the second electrode EL2 of the display element layer DPL.

The third interlayer insulating layer ILD3 is positioned over the first bridge electrode BR1, the second bridge electrode BR2, the driving voltage line DVL, and the second interlayer insulating layer ILD2. The third interlayer insulating layer ILD3 covers the first bridge electrode BR1, the second bridge electrode BR2, the driving voltage line DVL, and the second interlayer insulating layer ILD2.

The third interlayer insulating layer ILD3 may include at least one of silicon nitride (SiN$_x$), silicon oxide (SiO$_x$), and silicon oxynitride (SiO$_x$N$_y$). In one or more embodiments, the third interlayer insulating layer ILD3 may be an organic insulating film including organic material.

Referring to FIGS. 4 and 5, the display element layer DPL of the display device according to one or more embodiments may include the via layer VIA, a bank BNK, the first electrode EL1, the second electrode EL2, the first insulating layer INS1, the light emitting element LD, an anchor ANC, a first contact electrode CNE1, and a second contact electrode CNE2. The display element layer DPL illustrated in FIG. 5 is a simplified diagram of a region of the light emitting element LD of the display element layer DPL illustrated in FIG. 4. Thus, the inclined side surfaces of a groove GRO and the first insulating layer INS1 of FIG. 4 may correspond to the vertical side surfaces of the groove GRO and the first insulating layer INS1 of FIG. 5.

The via layer VIA is positioned over the third interlayer insulating layer ILD3. The via layer VIA may include at least one organic insulating layer. The via layer VIA may be formed of a single-layer structure or a multilayer structure, and may include an inorganic insulating material or an organic insulating material. For example, the via layer VIA may include at least one of polyacrylates resin, epoxy resin, phenolic resin, polyamides resin, and polyimides resin.

A first surface of the via layer VIA may contact the third interlayer insulating layer ILD3, while a second surface of the via layer VIA may include the groove GRO. The groove GRO may be concave, and the groove GRO may be implemented in various sectional shapes, such as a rectangle, a square, a semicircle, a trapezoid, and an inverted trapezoid.

The light emitting element LD may be disposed in the groove GRO of the via layer VIA.

The groove GRO may be formed to have a width W1 that allows the light emitting element LD to be disposed in the direction of the length L (or the first direction DR1). For example, the width W1 of the groove may be greater than the length L of the light emitting element LD.

Further, the groove GRO may be formed to have a sufficient depth DE so that the light emitting element LD is accommodated in the direction of the diameter D of the light emitting element LD (or the third direction DR3). For example, the depth DE of the groove GRO may be greater than the diameter D of the light emitting element LD.

A first conductor OCD1 covering the end (e.g., both ends) of the light emitting element LD may be filled in the groove GRO. The first conductor OCD1 may be divided into a portion covering the first end EP1 of the light emitting element LD and a portion covering the second end EP2 of the light emitting element LD by the anchor ANC which will be described later. The first conductor OCD1 covering the first end EP1 of the light emitting element LD may directly contact the first contact electrode CNE1 which will be described later. Further, the first conductor OCD1 covering the second end EP2 of the light emitting element LD may directly contact the second contact electrode CNE2 which will be described later.

The first conductor OCD1 may include an organic conductor, and may include at least one of electron injection/ transport materials such as Phenyl-C61-butyric acid methyl ester (PCBM), Alq$_3$, LiF, PBD(1-(3,4-dimethoxyphenyl)-3-[3-(1H)-imidazol-1-yl)propyl]thiourea). Thus, the first conductor OCD1 may electrically connect the first end EP1 of the light emitting element LD and the first contact electrode CNE1, and the first conductor OCD1 may electrically connect the second end EP2 of the light emitting element LD and the second contact electrode CNE2.

The bank BNK is positioned over the via layer VIA. The bank BNK may be disposed below a portion of each of the first and second electrodes EL1 and EL2 to guide light emitted from the light emitting element LD in an image display direction of the display device (e.g., the upper direction of each pixel, the third direction DR3), so the portion of each of the first and second electrodes EL1 and EL2 may protrude upwards, i.e. in the third direction DR3. For example, first and second electrodes EL1 and EL2 may be disposed on the bank BNK and thus at least a portion of each of the first and second electrodes EU and EL2 may protrude upwards.

The bank BNK may include an inorganic insulating film formed of inorganic material or an organic insulating film formed of organic material. In one or more embodiments, the bank BNK may include a single organic insulating layer or a single inorganic insulating layer, but the present disclosure is not limited thereto.

Each of the first and second electrodes EL1 and EL2 is positioned over the bank BNK, and has a surface corresponding to the shape of the bank BNK. The first electrode EL1 and the second electrode EL2 may include a material having a uniform reflectivity. Thus, the light emitted from the light emitting element LD by the first electrode EL1 and the second electrode EL2 may travel in the image display direction (i.e., the third direction DR3) of the display device. In one or more embodiments, the first electrode EL1 may be an anode, and the second electrode EL2 may be a cathode.

Furthermore, a portion of the first electrode EL1 and a portion of the second electrode EL2 may be positioned over the via layer VIA. The second electrode EL2 may be spaced from the first electrode EL1 with the groove GRO being positioned therebetween.

The first insulating layer INS1 is positioned to cover the first electrode EL1, the second electrode EL2, and the via layer VIA. The first insulating layer INS1 may at least partially expose the upper surface of the first electrode EL1 and the upper surface of the second electrode EL2. Further, the first insulating layer INS1 may be positioned to cover the surface of the groove GRO of the via layer VIA. In other words, the first insulating layer INS1 positioned inside the groove GRO may be disposed to correspond to the shape of the groove GRO.

A distance W2 between portions of the first insulating layer INS1 positioned inside the groove GRO may be wider than the length L of the light emitting element LD.

The light emitting element LD is positioned over the first insulating layer INS1 in the groove GRO. The light emitting element LD may be disposed between the first electrode EL1 and the second electrode EL2 in the first direction DR1. In one or more embodiments, a plurality of light emitting elements LD may be disposed inside the groove GRO, and the plurality of light emitting elements LD may be connected to each other in parallel.

The first end EP1 of the light emitting element LD may be disposed to face (or oppose) the first electrode EL1, and the second end EP2 of the light emitting element LD may be disposed to face (or oppose) the second electrode EL2.

The anchor ANC is positioned over the light emitting element LD inside the groove GRO of the via layer VIA. The anchor ANC may be positioned over a portion of the light emitting element LD, and cover to enclose a portion of the upper surface and the side surface of the light emitting element LD, thus stably fixing the light emitting element LD.

The anchor ANC may include an organic material, and may be implemented in a shape to be positioned inside the groove GRO in the first direction DR1 and/or the third direction DR3. In other words, the anchor ANC may be implemented in various sectional shapes such as a rectangle, a square, a trapezoid, and an inverted trapezoid.

The anchor ANC may be positioned so that a portion thereof is outside the groove GRO in the third direction DR3. Further, the anchor ANC may be implemented in various shapes. For example, when the anchor ANC has a rectangular or square section, the diameter DD of the upper side and the diameter DD of the lower side of the anchor ANC may be the same as each other. When the anchor ANC has a trapezoidal section, the diameter DD of the upper side thereof may be smaller than the diameter DD of the lower side thereof. Various shapes of the anchor ANC will be described below with reference to FIGS. 12 and 13.

The anchor ANC exposes the first end EP1 and the second end EP2 of the light emitting element LD. The first end EP1 of the exposed light emitting element LD may be electrically connected to the first contact electrode CNE1, which will be described later, through the first conductor OCD1. Further, the second end EP2 of the exposed light emitting element LD may be electrically connected to the second contact electrode CNE2, which will be described later, through the first conductor OCD1.

The first contact electrode CNE1 and the second contact electrode CNE2 are spaced from each other with the anchor ANC interposed therebetween.

The first contact electrode CNE1 is positioned to contact at least the first insulating layer INS1, the first conductor OCD1, and the anchor ANC. The first contact electrode CNE1 may be positioned on the upper surface of the first insulating layer INS1 and the upper surface of the first conductor OCD1, and may be positioned on the side surface of the anchor ANC.

The first contact electrode CNE1 may contact the first electrode EL1 exposed by the first insulating layer INS1 to be physically and electrically connected to the first electrode EL1. Thus, the first contact electrode CNE1 may transfer the voltage of the first driving power supply VDD (see FIG. 2) transmitted from the first electrode EL1 to the first end EP1 of the light emitting element LD.

The second contact electrode CNE2 is positioned to contact at least the first insulating layer INS1, the first conductor OCD1, and the anchor ANC. The second contact electrode CNE2 may be positioned on the upper surface of the first insulating layer INS1 and the upper surface of the first conductor OCD1, and may be positioned on the side surface of the anchor ANC. The second contact electrode CNE2 may contact the second electrode EL2 exposed by the first insulating layer INS1 to be physically and electrically connected to the second electrode EL2. Thus, the second contact electrode CNE2 may transfer the voltage of the second driving power supply VSS (see FIG. 2) transmitted from the second electrode EL2 to the second end EP2 of the light emitting element LD.

The first contact electrode CNE1 and the second contact electrode CNE2 may be formed of a transparent conductive material. For instance, the first contact electrode CNE1 and the second contact electrode CNE2 may include a material such as indium tin oxide (ITO), indium zinc oxide (IZO), or indium tin zinc oxide (ITZO). Thus, the light emitted from the light emitting element LD and reflected by the first electrode EL1 and the second electrode EL2 may travel in the image display direction (i.e., the third direction DR3) of the display device.

In one or more embodiments, the first contact electrode CNE1 and the second contact electrode CNE2 may be electrically connected to the light emitting element LD through the first conductor OCD1. In other words, in one or more embodiments, the first contact electrode CNE1 and the second contact electrode CNE2 are placed flat on the first conductor OCD1 and electrically connected to the light emitting element LD via the first conductor OCD1, thus solving a short circuit issue that may occur due to the direct contact of the contact electrodes CNE1 and CNE2 with the ends EP1 and EP2 of the light emitting element LD.

In one or more embodiments, an insulating layer may be further disposed on the upper surfaces of the first contact electrode CNE1, the second contact electrode CNE2, and the anchor ANC. The insulating layer may include at least one organic film and inorganic film, and may be entirely positioned on the surface of the display element layer DPL.

Hereinafter, the planar arrangement of a display device in accordance with one or more embodiments will be described with reference to FIGS. 6 to 7.

Figure 6:
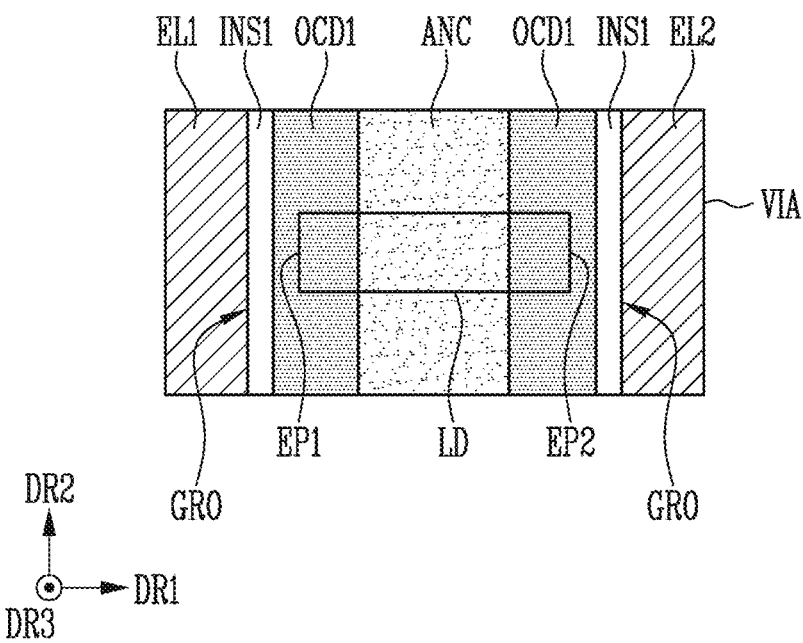
FIG. 6 is a plan view schematically illustrating the arrangement of a display device in accordance with one or more embodiments.
Figure 7:
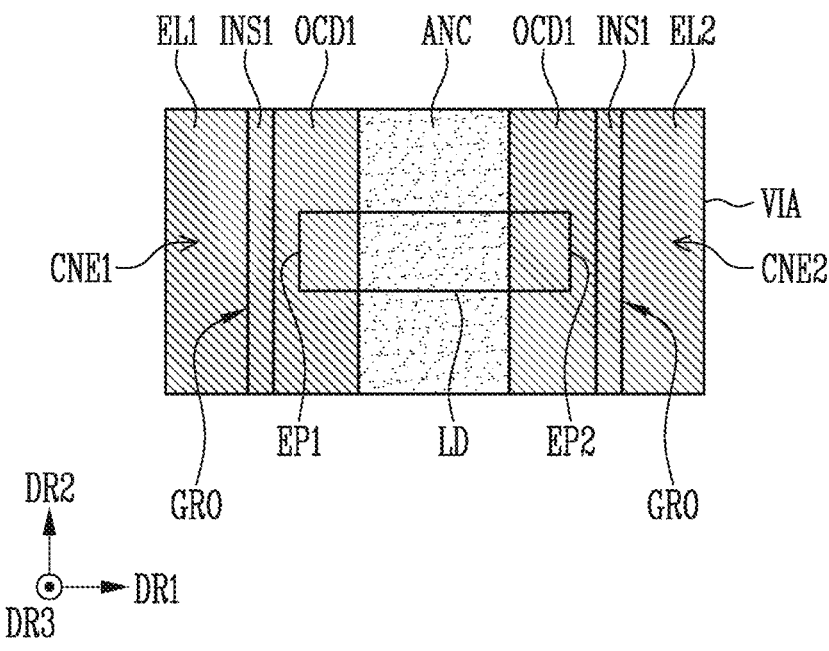
FIG. 7 is a plan view schematically illustrating the arrangement of a display device in accordance with one or more embodiments.

FIG. 6 is a plan view schematically illustrating the arrangement of a display device in accordance with one or more embodiments, and FIG. 7 is a plan view schematically illustrating an arrangement of a display device in accordance with one or more embodiments.

For the convenience of description, some of transistors electrically connected to the light emitting elements LD and signal lines electrically connected to the transistors are omitted in FIGS. 6 and 7.

Because the plan views of FIGS. 6 and 7 are mainly illustrated based on the sectional view of FIG. 5, some explanation will be omitted if deemed redundant.

Referring to FIGS. 6 and 7, the display device in accordance with one or more embodiments may include the via layer VIA, the first electrode EL1, the second electrode EL2, the first insulating layer INS1, the light emitting element LD, the first conductor OCD1, and/or the anchor ANC. Furthermore, referring to FIG. 7, the display device in accordance with one or more embodiments may further include the first contact electrode CNE1 and the second contract electrode CNE2.

The via layer VIA may include the groove GRO in which the light emitting element LD is disposed. The first end EP1 of the light emitting element LD and the second end EP2 of the light emitting element LD may be positioned inside the groove GRO.

The first electrode EL1 and the second electrode EL2 are spaced from each other in the first direction DR1 with the light emitting element LD interposed therebetween. The first end EP1 of the light emitting element LD is spaced from the first electrode EL1, and the second end EP2 of the light emitting element LD is spaced from the second electrode EL2.

The first insulating layer INS1 at least partially overlaps the groove GRO, and is positioned to cover the first electrode EL1 and the second electrode EL2. In the first direction DR1, the edge of the first insulating layer INS1 may be spaced from the first end EP1 and the second end EP2 of the light emitting element LD.

The first conductor OCD1 may be positioned inside the groove GRO. For example, the first conductor OCD1 may be positioned between both edges of the first insulating layer INS1 in the first direction DR1. Further, the first conductor OCD1 may be positioned to at least partially overlap the light emitting element LD.

The anchor ANC extends in the second direction DR2, and is positioned to overlap a portion of the light emitting element LD. In other words, the anchor ANC is positioned to overlap the central portion of the light emitting element LD, and exposes the first end EP1 and the second end EP2 of the light emitting element LD.

The first contact electrode CNE1 and the second contact electrode CNE2 are spaced from each other with the anchor ANC interposed therebetween.

The first contact electrode CNE1 may be positioned to at least partially overlap the first end EP1 of the light emitting element LD in the third direction DR3, and the second contact electrode CNE2 may be positioned to at least partially overlap the second end EP2 of the light emitting element LD in the third direction DR3.

The first contact electrode CNE1 may overlap the first electrode EL1, the first insulating layer INS1, and the first conductor OCD1 covering the first end EP1 of the light emitting element LD. Thus, the first contact electrode CNE1 may be electrically connected to the first end EP1 of the light emitting element LD through the first conductor OCD1.

The second contact electrode CNE2 may overlap the second electrode EL2, the first insulating layer INS1, and the first conductor OCD1 covering the second end EP2 of the light emitting element LD. Thus, the second contact electrode CNE2 may be electrically connected to the second end EP2 of the light emitting element LD through the first conductor OCD1.

Thus, in one or more embodiments, the first contact electrode CNE1 and the second contact electrode CNE2 are placed flat on the first conductor OCD1 and electrically connected to the light emitting element LD, thus solving a short circuit issue that may occur due to the direct contact of the contact electrodes CNE1 and CNE2 with the ends EP1 and EP2 of the light emitting element LD, respectively.

Hereinafter, a method of manufacturing a display device in accordance with one or more embodiments will be described with reference to FIGS. 8 to 11.

FIGS. 8 to 11 are sectional views sequentially illustrating a method of manufacturing a display device in accordance with one or more embodiments. The display device manufactured through FIGS. 8 to 11 is the display device shown in FIG. 5. Hereinafter, in order to prevent a duplicate description, contents overlapping those described in FIG. 5 will be omitted.

Figure 8:
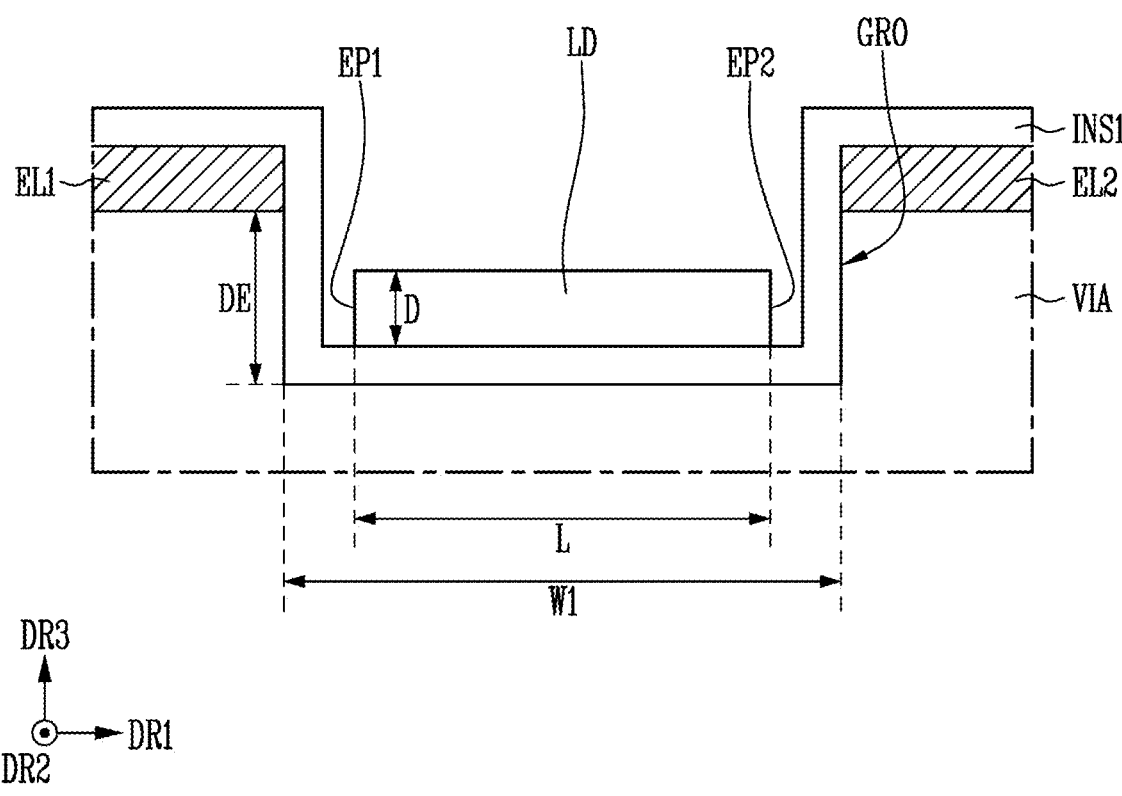
FIGS. 8 to 11 are sectional views sequentially illustrating a method of manufacturing a display device in accordance with one or more embodiments.

First, referring to FIG. 8, on the via layer VIA in which the groove GRO is formed, the light emitting element LD is aligned in the groove GRO.

The groove GRO configured to dispose the light emitting element LD is formed in the via layer VIA. The first electrode EL1 and the second electrode EL2 are formed over the via layer VIA with the groove GRO interposed therebetween. Subsequently, the first insulating layer INS1 is formed to cover the first electrode EL1, the second electrode EL2, and the groove GRO.

The width W1 of the groove GRO may be greater than the length L of the light emitting element LD. Further, the depth DE of the groove GRO may be greater than the diameter D of the light emitting element LD.

The first electrode EL1 and the second electrode EL2 may be used as alignment electrodes by applying an alignment voltage after a mixed solution (e.g., ink) including the light emitting element LD is injected into the groove GRO. The first electrode EL1 may be a first alignment electrode, and the second electrode EL2 may be a second alignment electrode. Here, the light emitting element LD may be aligned in a desired direction and/or position by an electric field formed between the first alignment electrode (e.g., the first electrode EL1) and the second alignment electrode (e.g., the second electrode EL2). For instance, the first end EP1 of the light emitting element LD may be aligned towards the first electrode EL1, and the second end EP2 thereof may be aligned towards the second electrode EL2.

In one or more embodiments, the light emitting element LD is inserted and aligned in the concave groove GRO, so the alignment degree of the light emitting element LD can be enhanced compared to a structure in which the light emitting element LD may be disposed over the first electrode EL1 and the second electrode EL2.

In other words, the display device in accordance with a comparative example may form the first electrode EL1 and the second electrode EL2 on the upper surface of the flat via layer VIA, form the first insulating layer INS1 to cover the first electrode EL1 and the second electrode EL2, and dispose the light emitting element LD on the first insulating layer INS1 between the first electrode EL1 and the second electrode EL2. The structure according to the comparative example in which the light emitting element LD may be disposed over the first electrode EL1 and the second electrode EL2 may be lower in the alignment degree of the light emitting element LD than the structure according to one or more embodiments in which the light emitting element LD is aligned in the concave groove GRO.

Figure 9:
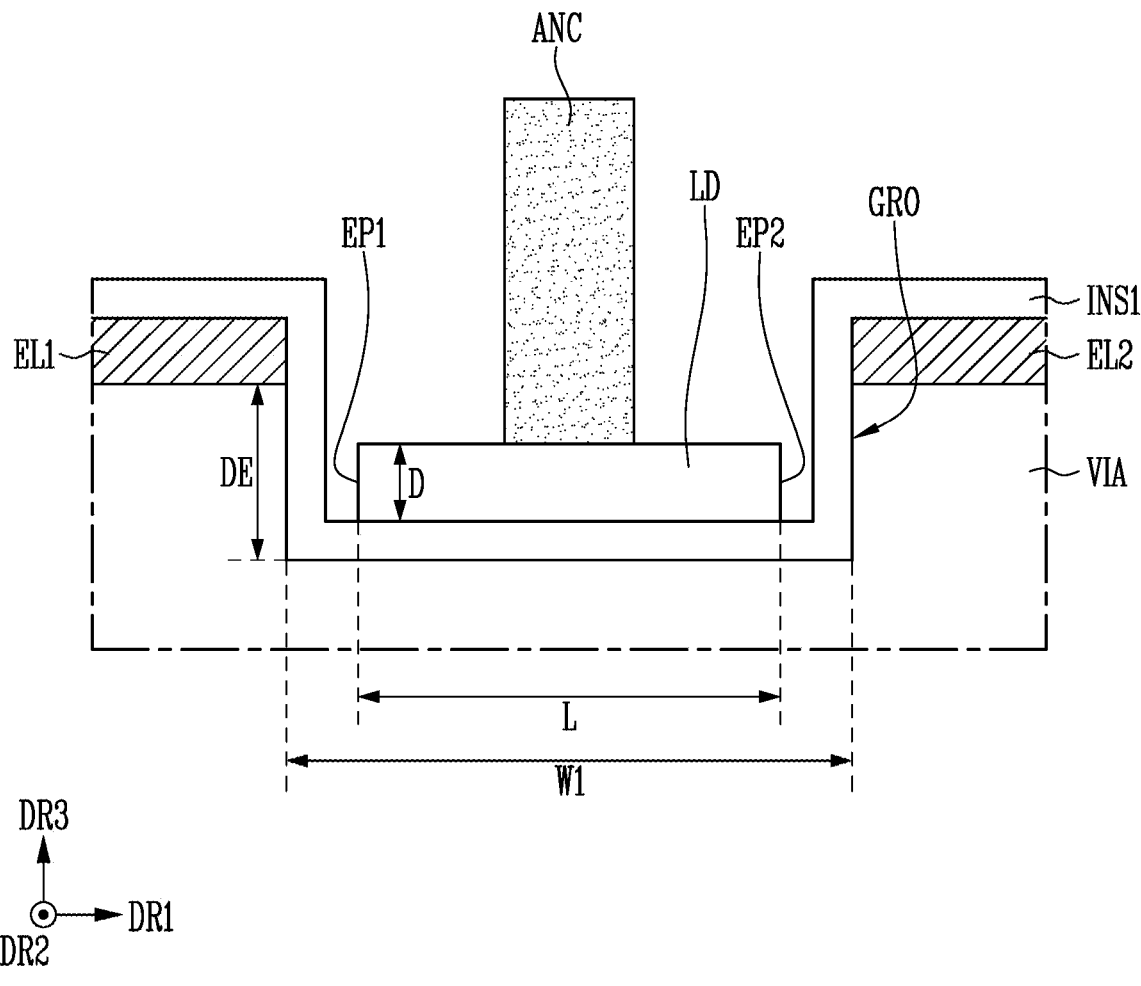

Referring to FIG. 9, the anchor ANC is formed over the light emitting element LD. The anchor ANC is formed to enclose a portion of the light emitting element LD in order to stably fix the light emitting element LD. The anchor ANC may contain an organic material.

Figure 10:
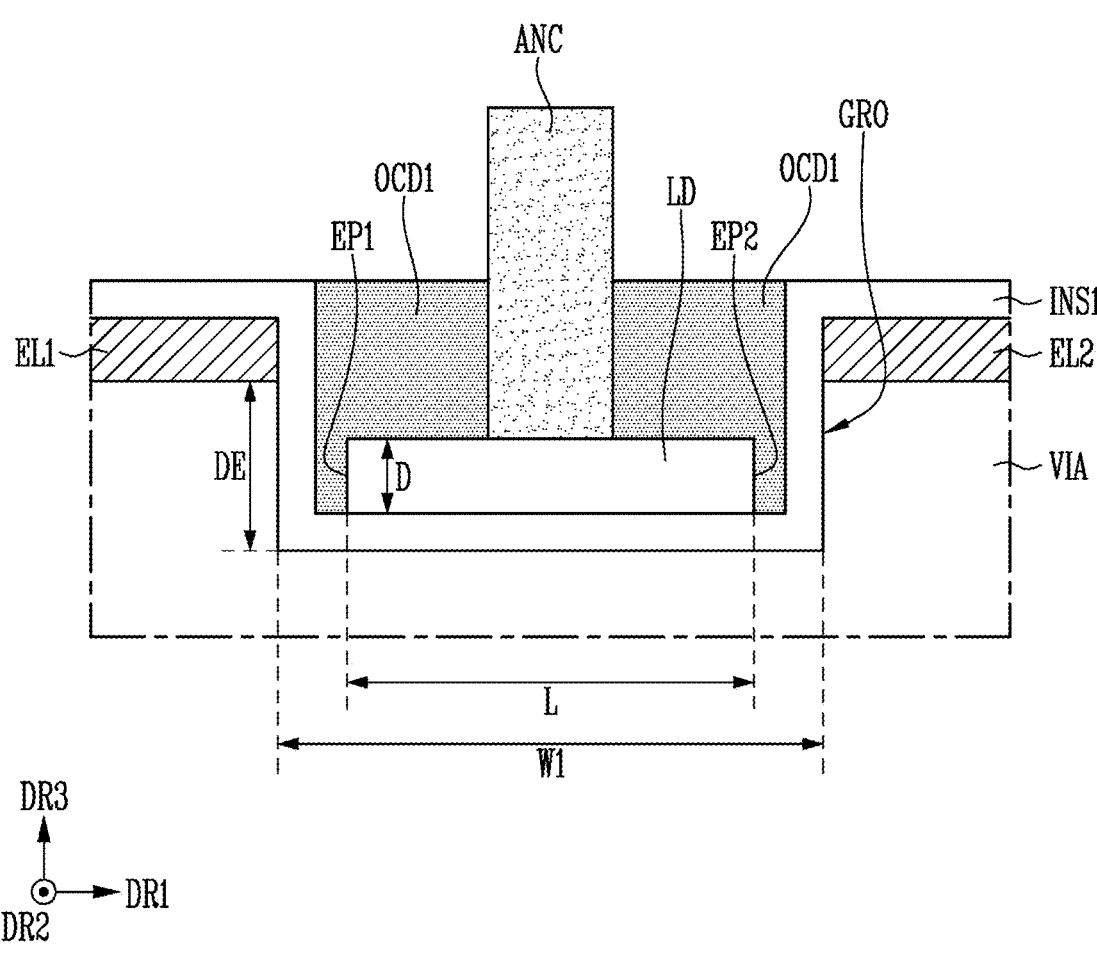

Referring to FIG. 10, the first conductor OCD1 is formed in the groove GRO to cover the ends EP1 and EP2 of the light emitting element LD. Based on the anchor ANC, the first conductor OCD1 may be formed in the groove GRO to cover the first end EP1 of the light emitting element LD on the first side of the anchor ANC, and the first conductor OCD1 may be formed in the groove GRO to cover the second end EP2 of the light emitting element LD on the second side of the anchor ANC. Thus, the upper surface of the first conductor OCD1 may be formed to be positioned on the same plane as the upper surface of the first insulating layer INS1 in the first direction DR1.

Figure 11:
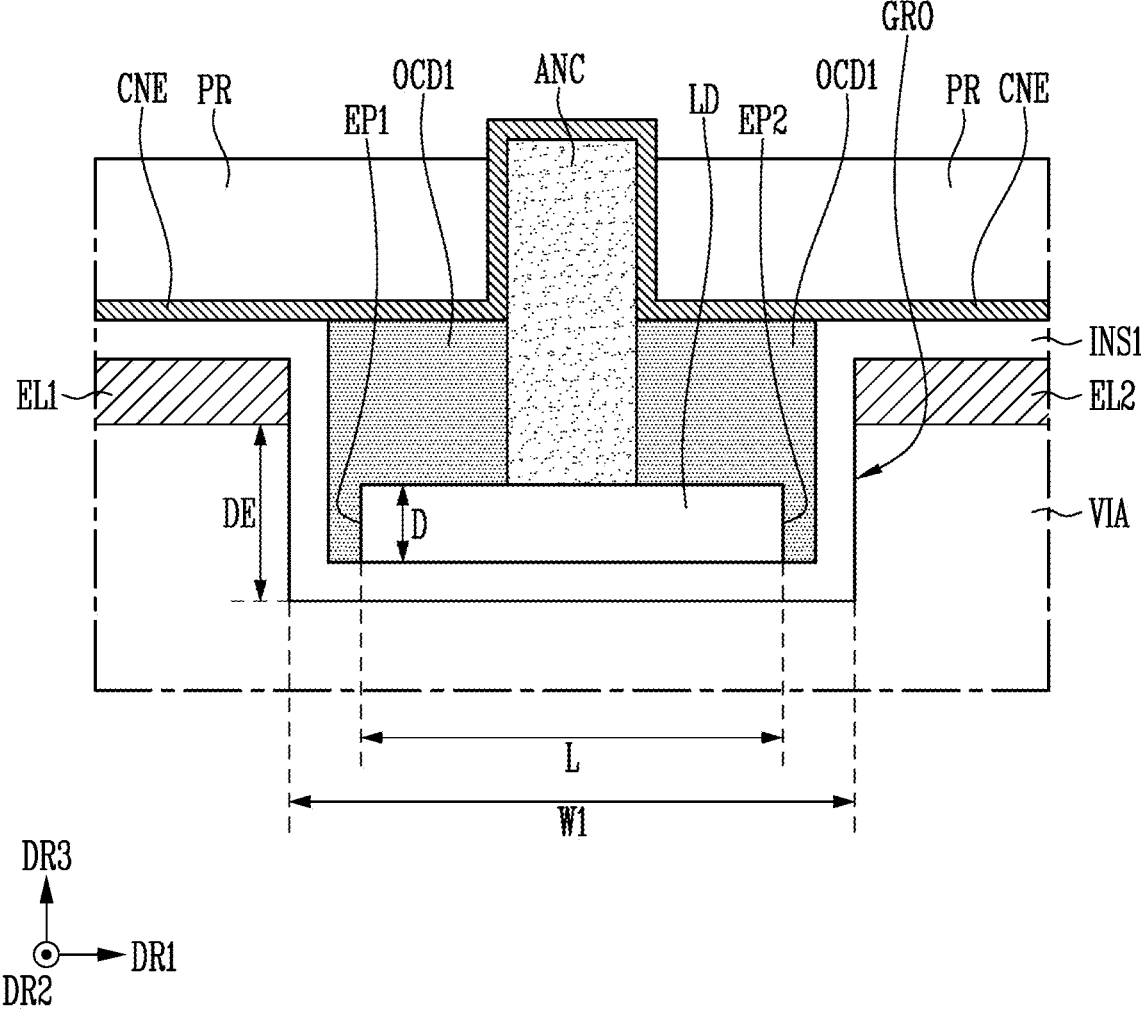

Referring to FIG. 11, the contact electrode CNE is formed on the first insulating layer INS1, the first conductor OCD1, and the anchor ANC, and a photoresist PR is applied onto a portion of the contact electrode CNE.

The contact electrode CNE may be formed to extend in the first direction DR1 and the third direction DR3 along the surfaces of the first insulating layer INS1, the first conductor OCD1, and the anchor ANC.

The photoresist PR may be applied such that portions thereof are spaced from each other with respect to the anchor ANC. By using a halftone mask, the height of the photoresist PR may be formed to be lower than the upper surface of the anchor ANC.

Thereafter, the first contact electrode CNE1 and the second contact electrode CNE2 may be formed by etching the other portion of the anchor ANC exposed by the photoresist PR and removing the photoresist PR.

The display device in accordance with one or more embodiments formed through the process of FIGS. 8 to 11 can be seen in FIG. 5.

In one or more embodiments, the first contact electrode CNE1 and the second contact electrode CNE2 are placed flat on the first conductor OCD1 and electrically connected to the light emitting element LD, thus solving a short circuit issue that may occur due to the direct contact of the contact electrodes CNE1 and CNE2 with the ends EP1 and EP2 of the light emitting element LD, respectively.

Hereinafter, a sectional view of a display device in accordance with one or more embodiments will be described with reference to FIGS. 12 and 13.

Figure 12:
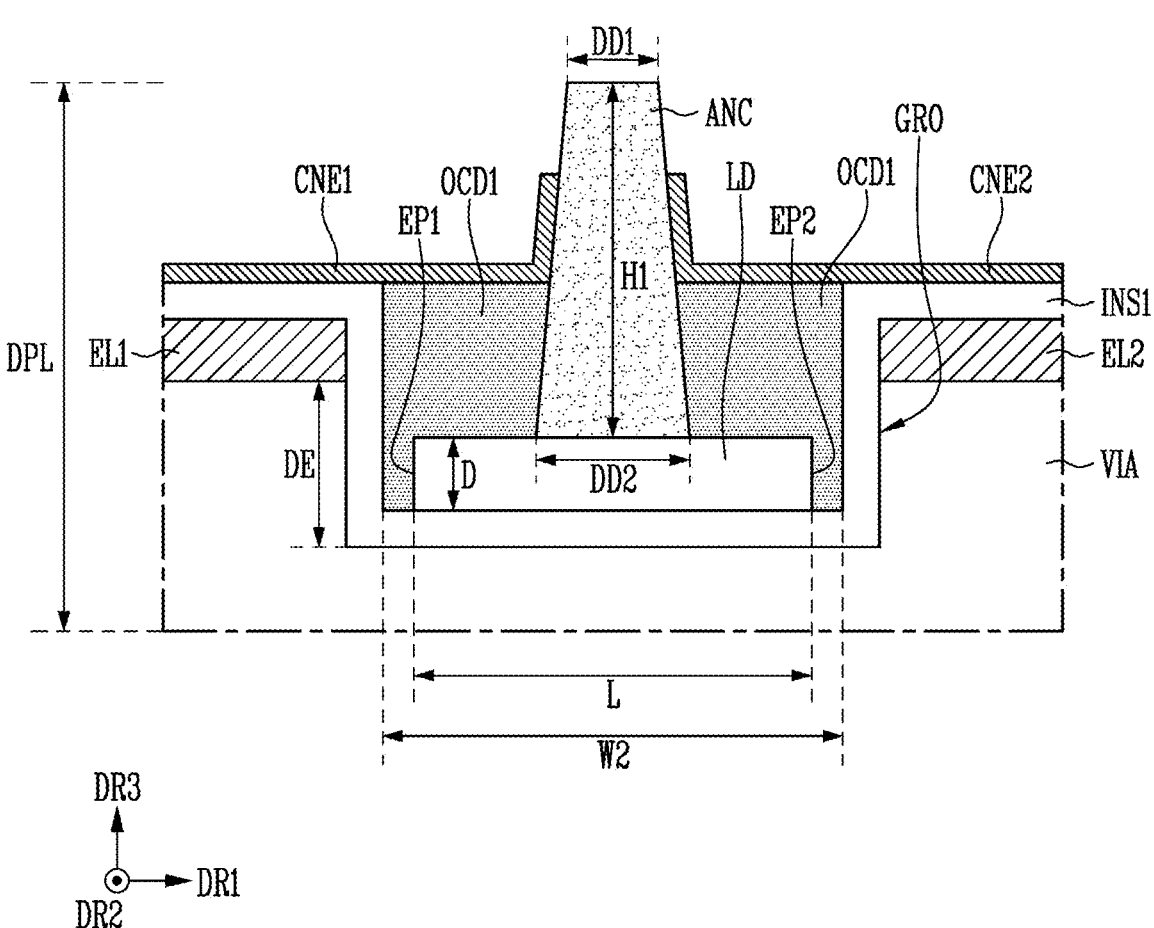
FIG. 12 is a sectional view illustrating a display device in accordance with one or more embodiments.
Figure 13:
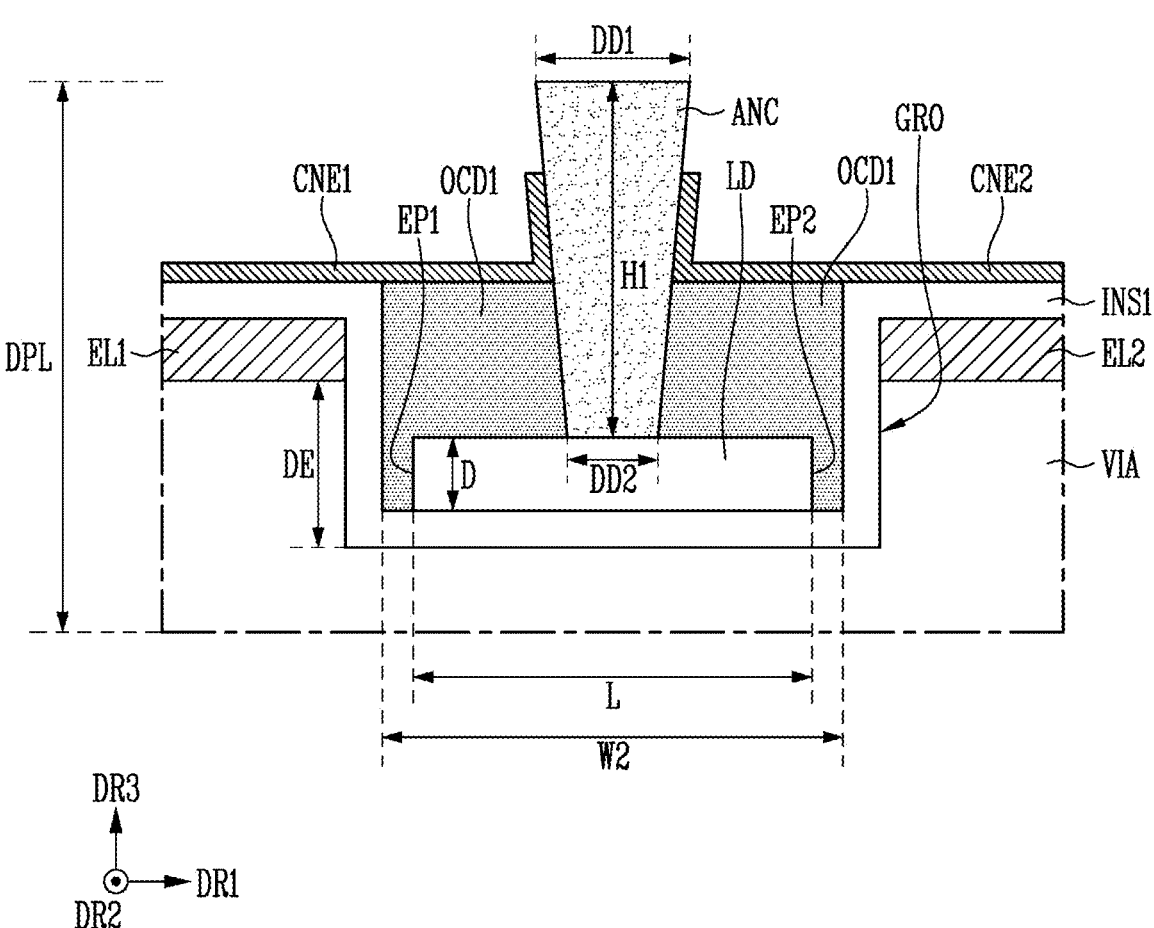
FIG. 13 is a sectional view illustrating a display device in accordance with one or more embodiments.

FIG. 12 is a sectional view illustrating a display device in accordance with one or more embodiments, and FIG. 13 is a sectional view illustrating a display device in accordance with one or more embodiments. Because FIGS. 12 and 13 are similar to the sectional view shown in FIG. 5, a redundant description will be omitted below.

Referring to FIG. 12, the display device in accordance with one or more embodiments includes an anchor ANC having a trapezoidal section. Referring to FIG. 13, the display device in accordance with one or more embodiments includes an anchor ANC having an inverted trapezoidal section.

First, in FIG. 12, the anchor ANC may include an organic material, and may be implemented in a shape to be positioned inside the groove GRO in the first direction DR1.

The diameter DD1 of the upper side of the anchor ANC may be smaller than the diameter DD2 of the lower side thereof.

The first contact electrode CNE1 and the second contact electrode CNE2 are spaced from each other with the anchor ANC interposed therebetween.

The first contact electrode CNE1 may be positioned on the upper surface of the first insulating layer INS1 and the upper surface of the first conductor OCD1, and may be positioned on the side surface of the anchor ANC. To be more specific, the first contact electrode CNE1 may be formed along the flat upper surface of the first insulating layer INS1 and the flat upper surface of the first conductor OCD1, and may be formed along the inclined side surface of the anchor ANC to directly contact the side surface of the anchor ANC.

The second contact electrode CNE2 may be positioned on the upper surface of the first insulating layer INS1 and the upper surface of the first conductor OCD1, and may be positioned on the side surface of the anchor ANC. To be more specific, the second contact electrode CNE2 may be formed along the flat upper surface of the first insulating layer INS1 and the flat upper surface of the first conductor OCD1, and may be formed along the inclined side surface of the anchor ANC to directly contact the side surface of the anchor ANC.

In one or more embodiments, the first contact electrode CNE1 and the second contact electrode CNE2 may be electrically connected to the light emitting element LD through the first conductor OCD1. In other words, in one or more embodiments, the first contact electrode CNE1 and the second contact electrode CNE2 are placed flat on the first conductor OCD1 and electrically connected to the light emitting element LD, thus solving a short circuit issue that may occur due to the direct contact of the contact electrodes CNE1 and CNE2 with the ends EP1 and EP2 of the light emitting element LD, respectively.

In FIG. 13, the anchor ANC may include an organic material, and may be implemented in a shape to be positioned inside the groove GRO in the first direction DR1.

The diameter DD1 of the upper side of the anchor ANC may be greater than the diameter DD2 of the lower side thereof.

The first contact electrode CNE1 may be formed along the flat upper surface of the first insulating layer INS1 and the flat upper surface of the first conductor OCD1, and may be formed along the inclined side surface of the anchor ANC to directly contact the side surface of the anchor ANC.

The second contact electrode CNE2 may be formed along the flat upper surface of the first insulating layer INS1 and the flat upper surface of the first conductor OCD1, and may be formed along the inclined side surface of the anchor ANC to directly contact the side surface of the anchor ANC.

The first electrode EL1, the second electrode EL2, the first insulating layer INS1, the first conductor OCD1, and the light emitting element LD illustrated in FIG. 13 may have the same configuration as that described in FIGS. 5 and 12.

Hereinafter, a display device in accordance with one or more embodiments will be described with reference to FIG. 14.

Figure 14:
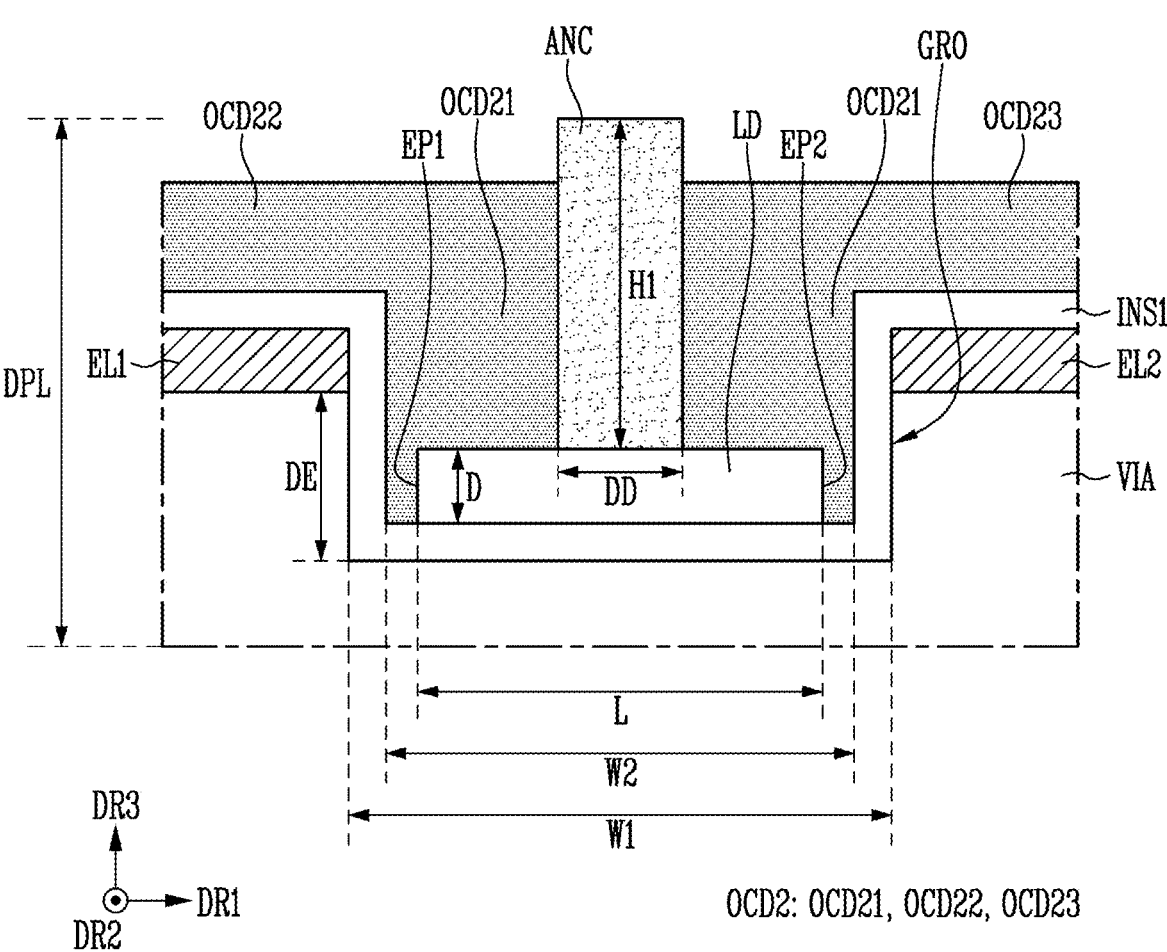
FIG. 14 is a sectional view illustrating a display element layer in a display device in accordance with one or more embodiments.

FIG. 14 is a sectional view illustrating a display element layer in a display device in accordance with one or more embodiments. Because FIG. 14 is similar to the sectional view shown in FIG. 5, a redundant description will be omitted below.

First, referring to FIG. 14, the display element layer DPL of the display device in accordance with one or more embodiments may include a via layer VIA, a first electrode EL1, a second electrode EL2, a first insulating layer INS1, a light emitting element LD, and an anchor ANC.

The via layer VIA may include a groove GRO. The groove GRO may be concave, and the groove GRO may be implemented in various sectional shapes, such as a rectangle, a square, a semicircle, a trapezoid, and an inverted trapezoid.

The light emitting element LD may be disposed in the groove GRO of the via layer VIA.

The groove GRO may be formed to have a width W1 that allows the light emitting element LD to be disposed in the direction of the length L. Further, the groove GRO may be formed to have a sufficient depth DE so that the light emitting element LD is accommodated in the direction of the diameter D.

A second conductor OCD2 covering the end of the light emitting element LD may be filled in the groove GRO. Furthermore, the second conductor OCD2 may be positioned over the first insulating layer INS1.

The second conductor OCD2 may include a first portion OCD21, a second portion OCD22, and a third portion OCD23 according to an arrangement position thereof.

The first portion OCD21 of the second conductor OCD2 may be positioned to cover the groove GRO, and may be divided into a portion covering the first end EP1 of the light emitting element LD and a portion covering the second end EP2 of the light emitting element LD by the anchor ANC.

The second portion OCD22 of the second conductor OCD2 may be physically and/or electrically connected to the first electrode EL1 through an exposed portion of the first insulating layer INS1. The second portion OCD22 of the second conductor OCD2 and the first portion OCD21 of the second conductor OCD2 that covers the first end EP1 of the light emitting element LD may be a component corresponding to the first contact electrode CNE1 of FIG. 5. In other words, the first portion OCD21 covering the second portion OCD22 of the second conductor OCD2 and the first end EP1 of the light emitting element LD may transfer the voltage of the first driving power supply VDD (see FIG. 2) transmitted through the first electrode EL1 to the first end EP1 of the light emitting element LD.

The third portion OCD23 of the second conductor OCD2 may be physically and/or electrically connected to the second electrode EL2 through the exposed portion of the first insulating layer INS1. The third portion OCD23 of the second conductor OCD2 and the first portion OCD21 of the second conductor OCD2 that covers the second end EP2 of the light emitting element LD may be a component corresponding to the second contact electrode CNE2 of FIG. 5. In other words, the first portion OCD21 covering the third portion OCD23 of the second conductor OCD2 and the second end EP2 of the light emitting element LD may transfer the voltage of the second driving power supply VSS (see FIG. 2) transmitted through the second electrode EL2 to the second end EP2 of the light emitting element LD.

The second conductor OCD2 may include $n^+$ amorphous silicon. The second conductor OCD2 may be a conductive material. For example, the material forming the second conductor OCD2 may use a chemical vapor deposition (CVD) method, and may be an inorganic material having less electrons and a high density. For instance, the second conductor OCD2 may be a material in which phosphorus is doped into amorphous silicon.

The first electrode EL1 and the second electrode EL2 are positioned over the via layer VIA to be spaced from each other with the groove GRO interposed therebetween.

The first insulating layer INS1 is positioned to cover the first electrode EL1, the second electrode EL2, and the via layer VIA. The first insulating layer INS1 may be positioned to cover the surface of the groove GRO of the via layer VIA. In other words, the first insulating layer INS1 positioned inside the groove GRO may be disposed to correspond to the shape of the groove GRO.

The anchor ANC exposes the first end EP1 and the second end EP2 of the light emitting element LD. The first end EP1 of the exposed light emitting element LD may be electrically connected to the first electrode EL1 through the second portion OCD22 of the second conductor OCD2. Further, the second end EP2 of the exposed light emitting element LD may be electrically connected to the second electrode EL2 through the third portion OCD23 of the second conductor OCD2.

Therefore, in one or more embodiments, the light emitting element LD may be electrically connected to the first driving power supply VDD (see FIG. 2) and the second driving power supply VSS (see FIG. 2) through the second conductor OCD2. In other words, in one or more embodiments, the second conductor OCD2 electrically connects the light emitting element LD to each driving power source as a contact electrode, thus solving a short circuit issue that may occur due to direct contact of the contact electrode with the ends EP1 and EP2 of the light emitting element LD.

Next, a method of manufacturing the display device shown in FIG. 14 will be described with reference to FIGS. 15 to 18.

FIGS. 15 to 18 are sectional views sequentially illustrating the method of manufacturing the display device shown in FIG. 14. Because FIGS. 15 to 18 are similar to the sectional views shown in FIGS. 8 to 11, a redundant description will be omitted.

Figure 15:
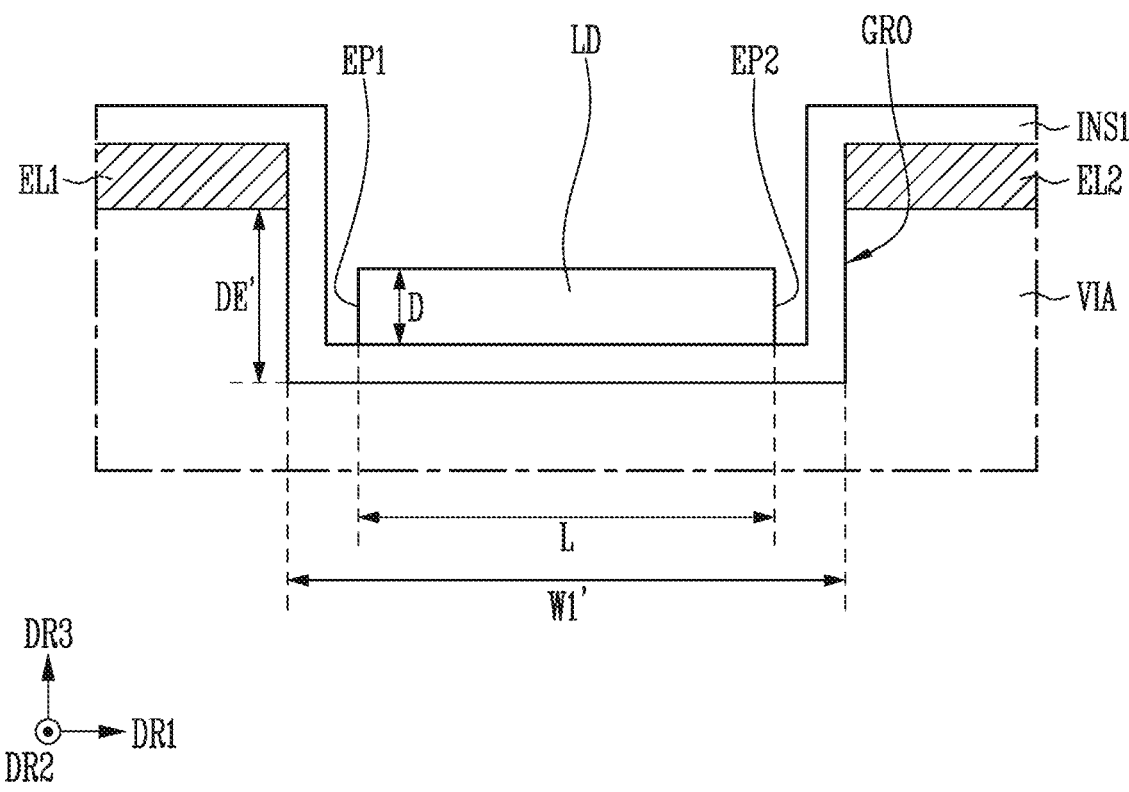
FIGS. 15 to 18 are sectional views sequentially illustrating a method of manufacturing a display device shown in FIG. 14.

First, referring to FIG. 15, the light emitting element LD is aligned on the via layer VIA in which the groove GRO is formed, and the first insulating layer INS1 is disposed.

Figure 16:
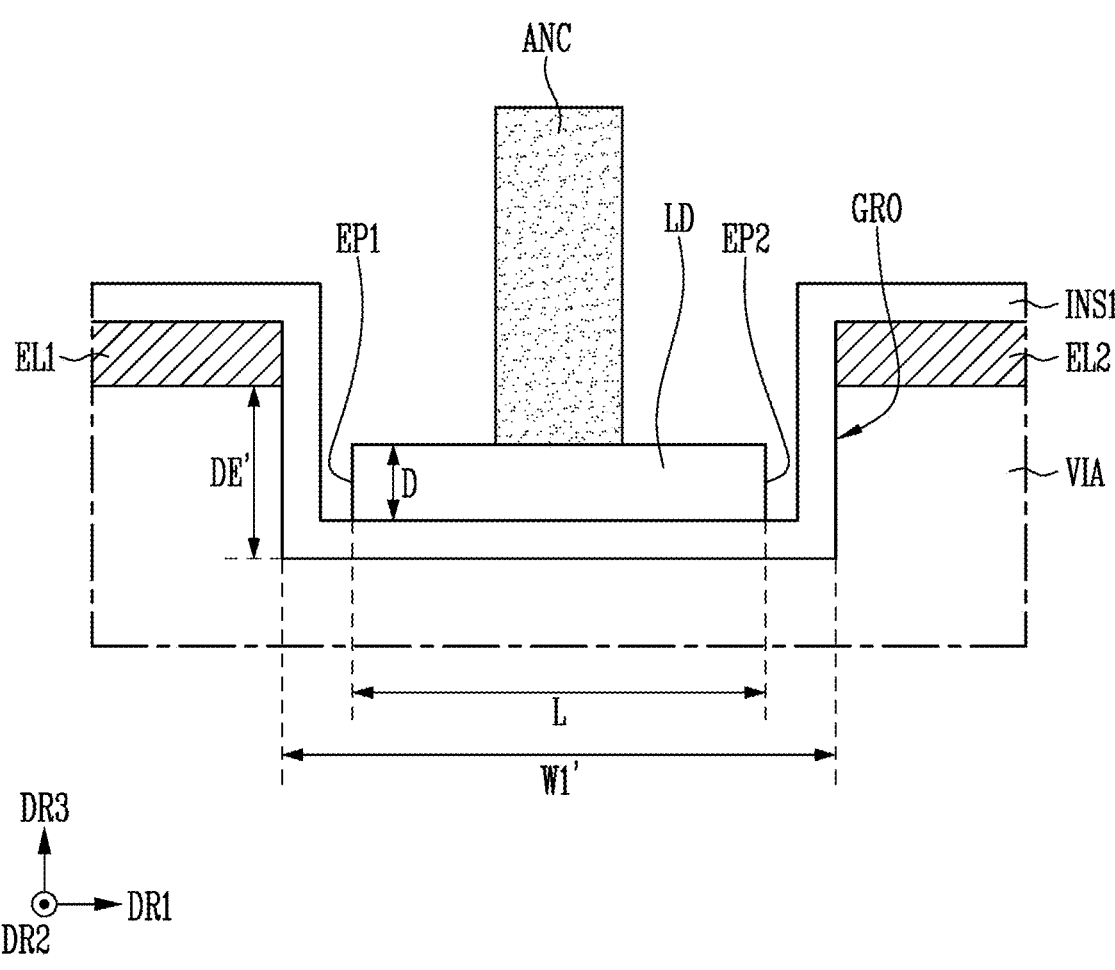

Referring to FIG. 16, the anchor ANC is formed over the light emitting element LD.

Figure 17:
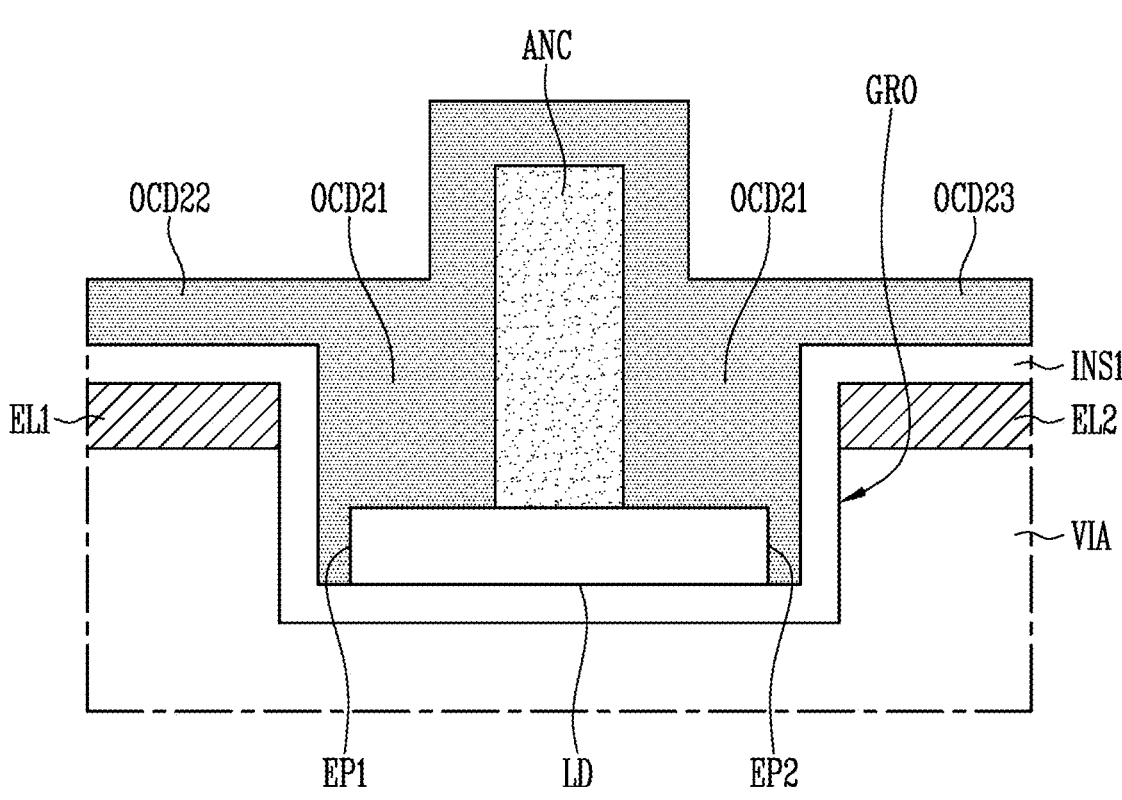
Figure 17:
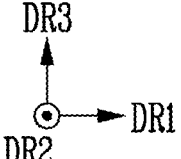

Referring to FIG. 17, the second conductor OCD2 is formed to fill the groove GRO and cover the anchor ANC and the first insulating layer INS1.

The first portion OCD21 of the second conductor OCD2 may be formed to cover the first end EP1 and the second end EP2 of the light emitting element LD within the groove GRO, and may be formed to cover the upper surface of the anchor ANC. Furthermore, the second portion OCD22 and the third portion OCD23 of the second conductor OCD2 may be formed to cover the surface of the first insulating layer INS1. In other words, the width W1' of the groove GRO may be greater than the length L of the light emitting element LD, and the depth DE' of the groove GRO may be greater than the diameter D of the light emitting element LD.

Figure 18:
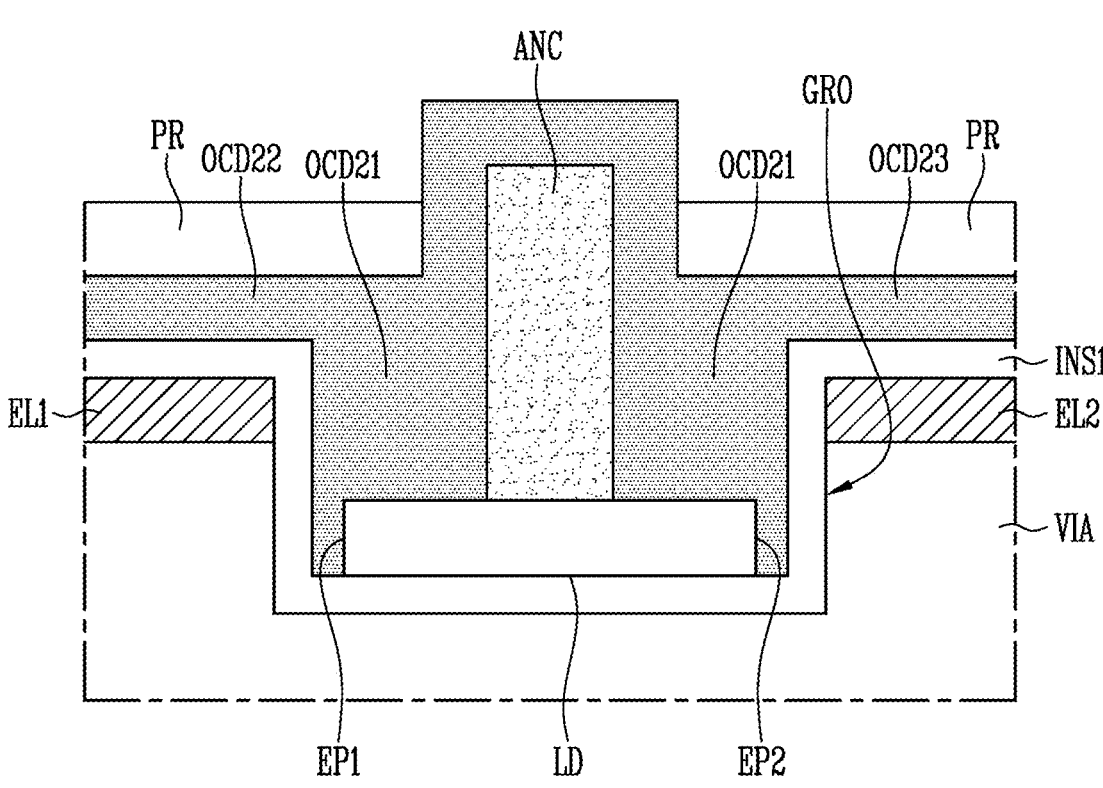
Figure 18:
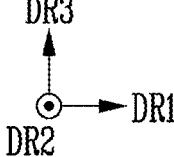

Referring to FIG. 18, the photoresist PR is applied onto the second conductor OCD2 positioned on opposite sides of the anchor ANC.

The photoresist PR may be applied such that portions thereof are spaced from each other with respect to the anchor ANC. By using the halftone mask, the height of the photoresist PR may be formed to be lower than the upper surface of the anchor ANC.

Subsequently, the second conductor OCD2 may be formed to cover the groove GRO and the first insulating layer INS1 by etching a portion of the anchor ANC exposed by the photoresist PR and removing the photoresist PR.

The display device in accordance with one or more embodiments formed through the process of FIGS. 15 to 18 can be seen in FIG. 14.

In one or more embodiments, the second conductor OCD2 electrically connects the light emitting element LD to each driving power source as a contact electrode, thus solving a short circuit issue that may occur due to direct contact of the contact electrode with the ends EP1 and EP2 of the light emitting element LD.

Hereinafter, a sectional view of a display device in accordance with one or more embodiments will be described with reference to FIGS. 19 and 20.

Figure 19:
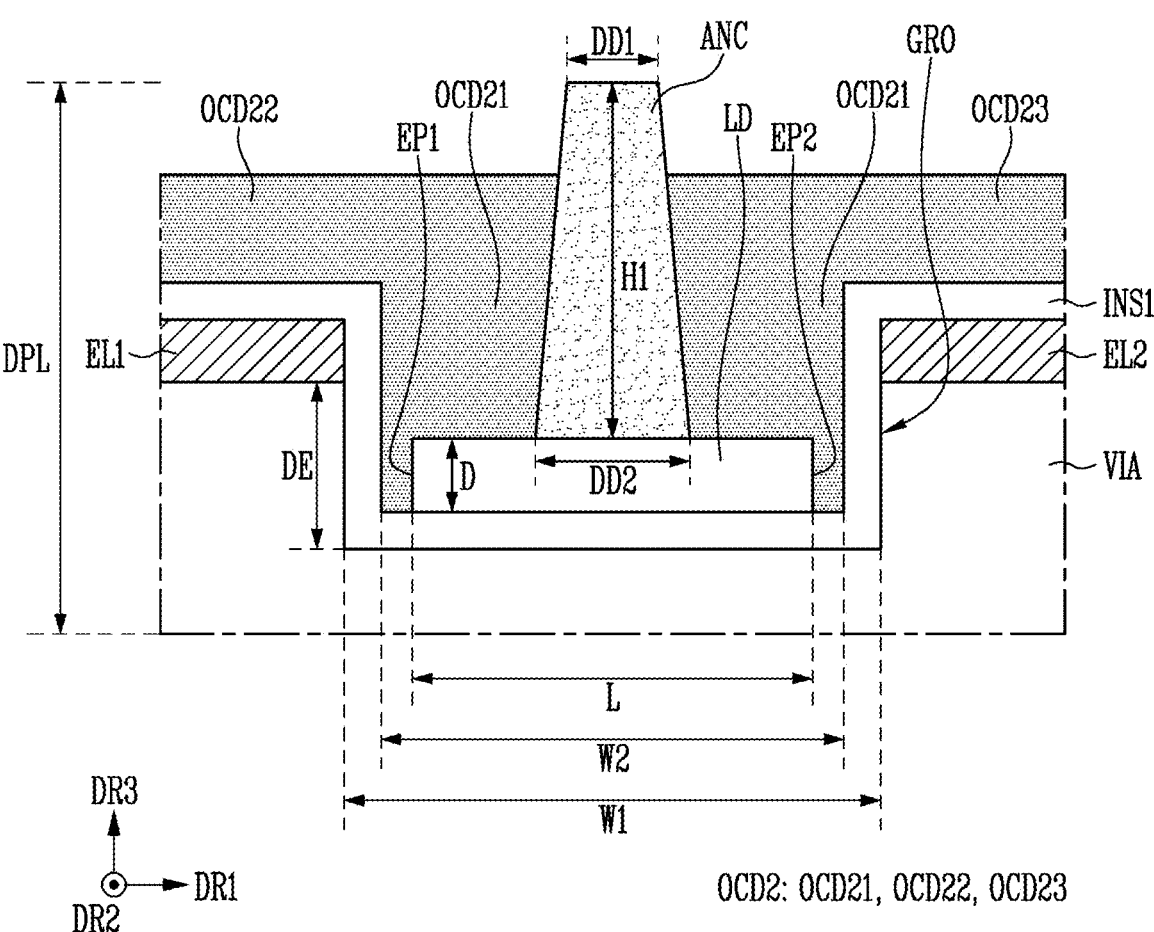
FIG. 19 is a sectional view illustrating a display device in accordance with one or more embodiments.
Figure 20:
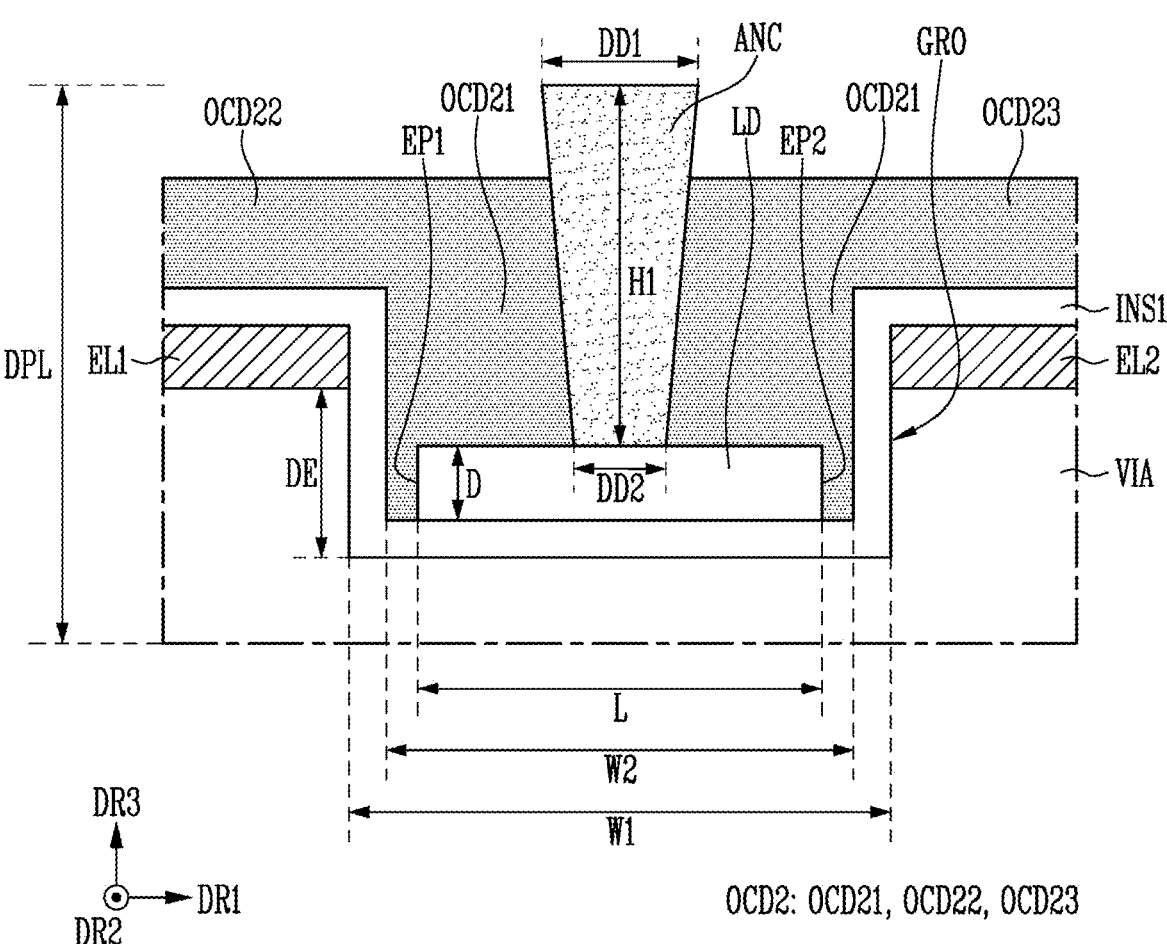
FIG. 20 is a sectional view illustrating a display device in accordance with one or more embodiments.

FIG. 19 is a sectional view illustrating a display device in accordance with one or more embodiments, and FIG. 20 is a sectional view illustrating a display device in accordance with one or more embodiments. Because FIGS. 19 and 20 are similar to the sectional views shown in FIGS. 12, 13, and 14, a redundant description will be omitted below.

Referring to FIG. 19, the display device in accordance with one or more embodiments includes an anchor ANC having a trapezoidal section. Referring to FIG. 20, the display device in accordance with one or more embodiments includes an anchor ANC having an inverted trapezoidal section.

First, in FIG. 19, the anchor ANC may include an organic material, and may be implemented in a shape to be positioned inside the groove GRO in the first direction DR1.

The diameter DD1 of the upper side of the anchor ANC may be smaller than the diameter DD2 of the lower side thereof.

The second conductor OCD2 may be positioned such that portions thereof are spaced from each other with the anchor ANC being interposed therebetween.

The first portion OCD21 of the second conductor OCD2 covering the first end EP1 of the light emitting element LD and the second portion OCD22 of the second conductor OCD2 may be electrically connected to the first electrode EL1.

The first portion OCD21 of the second conductor OCD2 covering the second end EP2 of the light emitting element LD and the third portion OCD23 of the second conductor OCD2 may be electrically connected to the second electrode EL2.

In one or more embodiments, the second conductor OCD2 electrically connects the light emitting element LD to each driving power source as a contact electrode, thus solving a short circuit issue that may occur due to direct contact of the contact electrode with the ends EP1 and EP2 of the light emitting element LD.

In FIG. 20, the anchor ANC may include an organic material, and may be implemented in a shape to be positioned inside the groove GRO in the first direction DR1.

The diameter DD1 of the upper side of the anchor ANC may be greater than the diameter DD2 of the lower side thereof.

The first portion OCD21 of the second conductor OCD2 covering the first end EP1 of the light emitting element LD and the second portion OCD22 of the second conductor OCD2 may be electrically connected to the first electrode EL1.

The first portion OCD21 of the second conductor OCD2 covering the second end EP2 of the light emitting element LD and the third portion OCD23 of the second conductor OCD2 may be electrically connected to the second electrode EL2.

In one or more embodiments, the second conductor OCD2 electrically connects the light emitting element LD to each driving power source as a contact electrode, thus solving a short circuit issue that may occur due to direct contact of the contact electrode with the ends EP1 and EP2 of the light emitting element LD.

Hereinafter, the problems of a display device in accordance with a comparative example will be described with reference to FIGS. 21A and 21B.

Figure 21A:
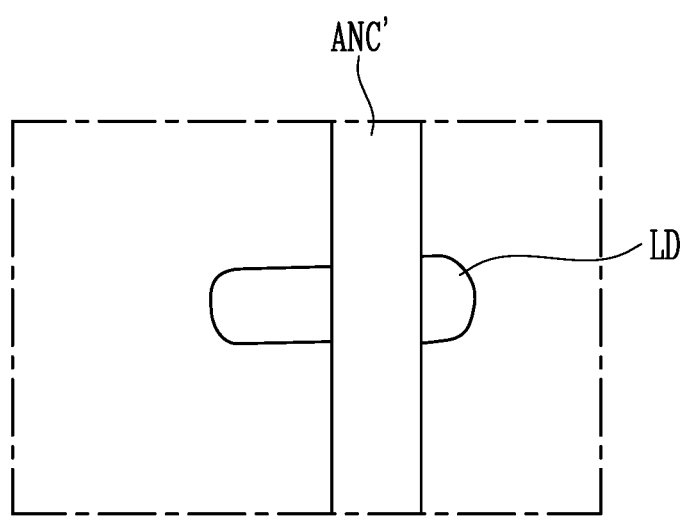
FIGS. 21A and 21B are a plan image and a sectional image of a display device in accordance with a comparative example.
Figure 21B:
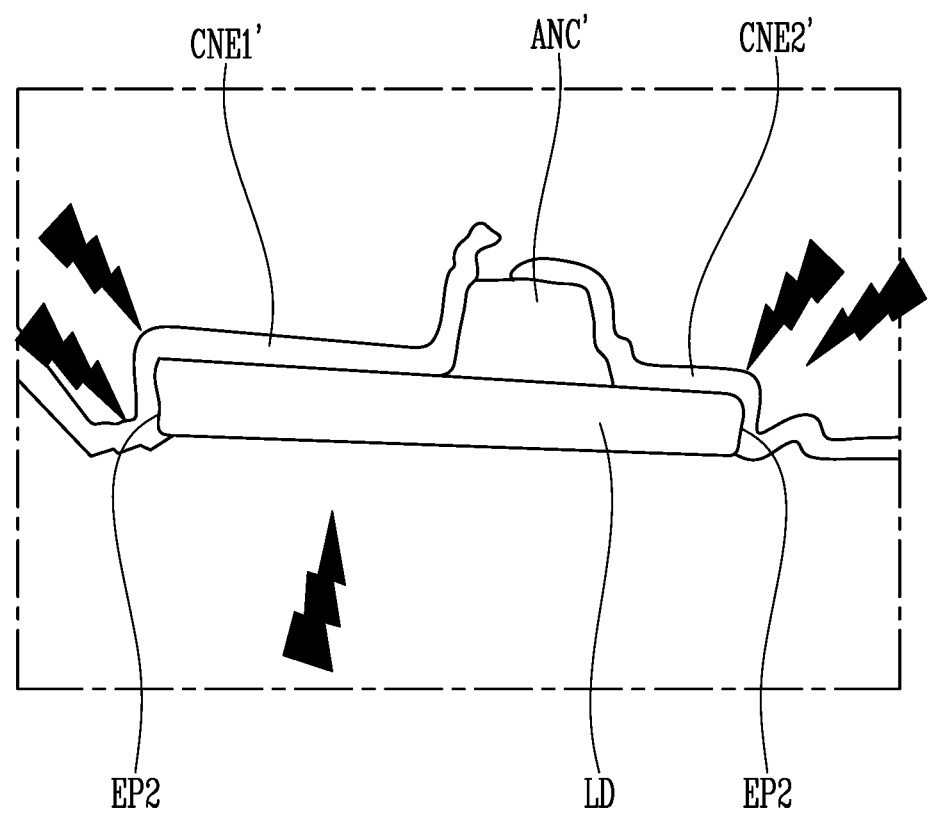

FIGS. 21A and 21B are a plan image and a sectional image of a display device in accordance with a comparative example. For example, FIG. 21A is a plan image of the display device in accordance with the comparative example, and FIG. 21B is a sectional image of the display device in accordance with the comparative example.

Referring to FIGS. 21A and 21B, in the display device according to the comparative example, an anchor ANC' partially covers the light emitting element LD, and the first end EP1 and the second end EP2 of the light emitting element LD are exposed. The first end EP1 of the light emitting element LD directly contacts a first contact electrode CNE1'. The second end EP2 of the light emitting element LD directly contacts a second contact electrode CNE2'.

Therefore, in the display device according to the comparative example, the first contact electrode CNE1' and the second contact electrode CNE2', which are thinly formed of a transparent conductive material, may cause a short circuit issue due to a step between the first end EP1 and the second end EP2 of the light emitting element LD.

In contrast, in one or more embodiments, as shown in FIG. 5, the first contact electrode CNE1 and the second contact electrode CNE2 are placed flat on the first conductor OCD1 and electrically connected to the light emitting element LD, thus solving a short circuit issue that may occur due to the direct contact of the contact electrodes CNE1 and CNE2 with the ends EP1 and EP2 of the light emitting element LD.

Further, in one or more embodiments, as shown in FIG. 14, the second conductor OCD2 electrically connects the light emitting element LD to each driving power source as a contact electrode, thus solving a short circuit issue that may occur due to direct contact of the contact electrode with the ends EP1 and EP2 of the light emitting element LD.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

According to one or more embodiments, a first contact electrode and a second contact electrode are placed flat on a first conductor and electrically connected to a light emitting element, thus solving a short circuit issue that may occur due to direct contact of the contact electrode with an end of the light emitting element.

According to one or more embodiments, a second conductor electrically connects a light emitting element to each driving power source as a contact electrode, thus solving a short circuit issue that may occur due to direct contact of the contact electrode with an end of the light emitting element.

Furthermore, a light emitting element is inserted and aligned in a concave groove, so the alignment degree of the light emitting element can be enhanced compared to a structure in which the light emitting element may be disposed over a first electrode and a second electrode.

The effects, aspects, and features of embodiments of the present disclosure are not limited by the foregoing, and other various effects, aspects, and features of embodiments are anticipated herein.

What is claimed is:

1. A display device comprising:
a base layer;
a via layer positioned on the base layer, the via layer having a concavely formed groove;
a light emitting element positioned in the groove;
a first electrode positioned on the via layer;
a second electrode positioned on the via layer and spaced from the first electrode; and
an anchor positioned on the light emitting element within the groove, wherein a first conductor is in the groove and covers ends of the light emitting element, and
wherein an entirety of an uppermost end of the anchor is further away from the base layer than an entirety of an uppermost top surface of the first conductor.

2. The display device according to claim 1, further comprising a first insulating layer covering at least a portion of the first electrode, at least a portion of the second electrode, and a surface of the groove.

3. The display device according to claim 2, further comprising a first contact electrode and a second contact electrode spaced from each other with the anchor being interposed therebetween.

4. The display device according to claim 3,
wherein the first contact electrode is positioned on an upper surface of the first conductor covering a first end of the light emitting element and an upper surface of the first insulating layer, and
wherein the first contact electrode is electrically connected to the first electrode exposed by the first insulating layer.

5. The display device according to claim 4, wherein the first contact electrode and the first end of the light emitting element are electrically connected to each other via the first conductor.

6. The display device according to claim 3,
wherein the second contact electrode is positioned on an upper surface of the first conductor covering a second end of the light emitting element and an upper surface of the first insulating layer, and
wherein the second contact electrode is electrically connected to the second electrode exposed by the first insulating layer.

7. The display device according to claim 6, wherein the second contact electrode and the second end of the light emitting element are electrically connected to each other via the first conductor.

8. The display device according to claim 1, wherein the first conductor comprises at least one of PCBM, $Alq_3$, LiF, and PBD(1-(3,4-dimethoxyphenyl)-3-[3-(1 H-imidazol-1-yl)propyl]thiourea).

9. The display device according to claim 1,
wherein a width of the groove is greater than a length of the light emitting element, and
wherein a depth of the groove is greater than a diameter of the light emitting element.

10. The display device according to claim 1,
wherein the anchor comprises an organic material, and
wherein diameters of upper and lower sides of the anchor are equal to or different from each other in a cross-section.

11. A display device comprising:
a base layer;
a via layer positioned on the base layer, the via layer having a concavely formed groove;
a light emitting element positioned in the groove;
a first electrode positioned on the via layer;
a second electrode positioned on the via layer and spaced from the first electrode;
a first insulating layer covering at least a portion of the first electrode, at least a portion of the second electrode, and a surface of the groove;
an anchor positioned on the light emitting element within the groove; and
a second conductor positioned on the first insulating layer, the second conductor covering ends of the light emitting element in the groove,
wherein an entirety of an uppermost end of the anchor is further away from the base layer than an entirety of an uppermost top surface of the second conductor.

12. The display device according claim 11,
wherein a first portion of the second conductor covers the groove,
wherein a second portion of the second conductor covers a first end of the light emitting element and is electrically connected to the first electrode, and
wherein a third portion of the second conductor covers a second end of the light emitting element, and is electrically connected to the second electrode.

13. The display device according to claim 11, wherein the second conductor comprises $n^+$ amorphous silicon.

14. The display device according to claim 11,
wherein the anchor comprises an organic material, and
wherein diameters of upper and lower sides of the anchor are equal to or different from each other in a cross-section.

15. The display device according to claim 11,
wherein a width of the groove is greater than a length of
   the light emitting element, and
wherein a depth of the groove is greater than a diameter
   of the light emitting element.

\* \* \* \* \*